United States Patent
Li et al.

(10) Patent No.: US 12,457,803 B2
(45) Date of Patent: Oct. 28, 2025

(54) DISPLAYING BASE PLATE AND MANUFACTURING METHOD THEREOF, AND DISPLAYING DEVICE

(71) Applicant: BOE Technology Group Co., Ltd., Beijing (CN)

(72) Inventors: Fuqiang Li, Beijing (CN); Zhen Zhang, Beijing (CN); Zhenyu Zhang, Beijing (CN); Lizhong Wang, Beijing (CN); Ce Ning, Beijing (CN); Yunping Di, Beijing (CN); Zheng Fang, Beijing (CN); Jiahui Han, Beijing (CN); Chenyang Zhang, Beijing (CN); Yawei Wang, Beijing (CN); Chengfu Xu, Beijing (CN)

(73) Assignee: Beijing BOE Technology Development Co., Ltd., Beijing (CN)

( * ) Notice: Subject to any disclaimer, the term of this patent is extended or adjusted under 35 U.S.C. 154(b) by 0 days.

(21) Appl. No.: 17/772,761

(22) PCT Filed: Jun. 29, 2021

(86) PCT No.: PCT/CN2021/103216
§ 371 (c)(1),
(2) Date: Apr. 28, 2022

(87) PCT Pub. No.: WO2023/272503
PCT Pub. Date: Jan. 5, 2023

(65) Prior Publication Data
US 2024/0162247 A1    May 16, 2024

(51) Int. Cl.
*H10D 86/60* (2025.01)
*H10D 86/01* (2025.01)
*H10D 86/40* (2025.01)

(52) U.S. Cl.
CPC ......... *H10D 86/60* (2025.01); *H10D 86/0231* (2025.01); *H10D 86/451* (2025.01); *H10D 86/421* (2025.01)

(58) Field of Classification Search
CPC .. H10D 86/60; H10D 86/0231; H10D 86/451; H10D 86/421
(Continued)

(56) References Cited

U.S. PATENT DOCUMENTS 9,917,198 B2 * 3/2018 Xie .................... H10D 30/6715
10,504,984 B2 * 12/2019 Gu ...................... H10D 30/611
(Continued)

FOREIGN PATENT DOCUMENTS

| CN | 104282696 A | 1/2015 |
|---|---|---|
| CN | 204130536 U | 1/2015 |

(Continued)

*Primary Examiner* — Ori Nadav
(74) *Attorney, Agent, or Firm* — WHDA, LLP

(57) ABSTRACT

Disclosed are a thin film transistor and a manufacturing method therefor, a displaying base plate and a displaying apparatus. The thin film transistor includes an active layer, a first insulating layer and a gate layer which are disposed in stack, wherein the active layer includes a source contact area, a drain contact area, and a channel area connecting the source contact area and the drain contact area; the channel area includes a first channel area, a first resistance area and a second channel area sequentially disposed in a first direction; the gate layer includes a first gate and a second gate which are separately disposed; an orthographic projection of the first gate on a plane where the active layer is located covers the first channel area; and an orthographic projection of the second gate on a plane where the active layer is located covers the second channel area.

11 Claims, 10 Drawing Sheets

(58) Field of Classification Search
USPC .......................................................... 257/72
See application file for complete search history.

(56) References Cited

U.S. PATENT DOCUMENTS

| | | |
|---|---|---|
| 2007/0273631 A1 | 11/2007 | Su et al. |
| 2016/0254283 A1* | 9/2016 | Shen ................ G02F 1/136286 |
| | | 257/72 |
| 2016/0260840 A1 | 9/2016 | Xie |
| 2020/0303560 A1 | 9/2020 | Guo et al. |
| 2021/0367003 A1 | 11/2021 | Zhou et al. |

FOREIGN PATENT DOCUMENTS

| | | |
|---|---|---|
| CN | 105405893 A | 3/2016 |
| CN | 106601822 A | 4/2017 |
| CN | 107037658 A | 8/2017 |
| CN | 107634087 A | 1/2018 |
| CN | 109901338 A | 6/2019 |
| CN | 109904222 A | 6/2019 |

* cited by examiner

DISPLAYING BASE PLATE AND MANUFACTURING METHOD THEREOF, AND DISPLAYING DEVICE

TECHNICAL FIELD

The present disclosure relates to the field of display technologies, and more particularly, to a thin film transistor and a manufacturing method thereof, a displaying base plate and a displaying apparatus.

BACKGROUND

A thin film transistor (TFT) is a core device of a display. Regardless of a liquid crystal display (LCD) or an organic light-emitting diode (OLED) display, the display of each pixel depends on the on-off and driving of the thin film transistor. According to materials of active layers of the thin film transistors, the current mainstream thin film transistors may be divided into amorphous silicon thin film transistors, polycrystalline silicon thin film transistors, oxide thin film transistors and the like.

However, the electrical performance parameters such as a threshold voltage of the existing TFT device perform poorly on stability in the working process, thereby affecting the display effect and reliability of a displaying device.

SUMMARY

The present disclosure provides a thin film transistor. The thin film transistor includes an active layer, a first insulating layer and a gate layer which are disposed in stack;
the active layer includes a source contact area, a drain contact area, and a channel area connecting the source contact area and the drain contact area; the channel area includes a first channel area, a first resistance area and a second channel area sequentially disposed in a first direction; and
the gate layer includes a first gate and a second gate which are separately disposed; an orthographic projection of the first gate on a plane where the active layer is located covers the first channel area; and an orthographic projection of the second gate on a plane where the active layer is located covers the second channel area.

In an optional implementation, a material of the active layer includes amorphous silicon, polycrystalline silicon or metal oxide.

In an optimal implementation, the material of the active layer includes the polycrystalline silicon; the source contact area includes a second resistance area and a first conductor area, the second resistance area being disposed close to the first channel area; the drain contact area includes a third resistance area and a second conductor area, the third resistance area being disposed close to the second channel area;
wherein the first resistance area, the second resistance area and the third resistance area are lightly doped areas, and the first conductor area and the second conductor area are heavily doped areas.

In an optional implementation, the second resistance area, the first conductor area, the third resistance area and the second conductor area are disposed in the first direction; and in the first direction, a width of the first resistance area is greater than a width of the second resistance area and a width of the third resistance area.

In an optional implementation, in the first direction, the width of the first resistance area is greater than or equal to 1 um and less than or equal to 2.5 um.

In an optional implementation, in the first direction, the width of the first resistance area is 1.5 um.

In an optional implementation, a width-to-length ratio of the first channel area is equal to that of the second channel area.

In an optional implementation, the width-to-length ratio of each of the first channel area and the second channel area is greater than or equal to 0.5 and less than or equal to 2.

In an optional implementation, the width-to-length ratio of each of the first channel area and the second channel area is 1.

The present disclosure provides a displaying base plate. The displaying base plate includes a substrate, and a first thin film transistor disposed on one side of the substrate, wherein the first thin film transistor is the thin film transistor according to any one of the above embodiments.

In an optional implementation, the displaying base plate includes an active area and a non-active area located at the periphery of the active area, and the first thin film transistor is located in the active area; and
the active area further includes a data line and scan lines, which are disposed on one side of the substrate that is close to the first thin film transistor; the data line extends in the first direction; the scan lines include a first scan line and a second scan line; the first gate extends in a second direction intersecting with the first direction to form the first scan line; the second gate extends in the second direction to form the second scan line; the source contact area is connected to the data line; and an orthographic projection of the channel area on the substrate is located in an orthographic projection range of the data line on the substrate.

In an optional implementation, the adjacent first scan line and the second scan line are connected by a connecting portion located between the two adjacent channel areas.

In an optional implementation, the active layer is located on one side of the gate layer that is close to the substrate; a second insulating layer is disposed on one side of the gate layer that is away from the substrate; a drain of the first thin film transistor is disposed on one side of the second insulating layer that is away from the substrate; the dram and the drain contact area are connected through via holes formed in the second insulating layer and the first insulating layer, and the drain is also connected to a first transparent electrode layer.

In an optional implementation, the first transparent electrode layer is multiplexed as the drain.

In an optional implementation, a material of the drain is a metal; an orthographic projection of the drain on the substrate and an orthographic projection of the drain contact area on the substrate are located in the orthographic projection range of the data line on the substrate; and the first transparent electrode layer is disposed on one side of the drain that is away from the substrate.

In an optional implementation, a third insulating layer is disposed on one side of the first transparent electrode layer that is away from the substrate; a second transparent electrode layer is disposed on one side of the third insulating layer that is away from the substrate; the second transparent electrode layer is connected to a first fixed potential input terminal; and an overlap exists between an orthographic projection of the second transparent electrode layer on the substrate and the orthographic projection of the first transparent electrode layer on the substrate.

In an optional implementation, a fourth insulating layer is disposed on one side of the second transparent electrode layer that is away from the substrate; the data line is disposed on one side of the fourth insulating layer that is away from the substrate; the data line and the source contact area are connected through via holes formed in the fourth insulating layer, the third insulating layer, the second insulating layer and the first insulating layer.

In an optional implementation, the displaying base plate further includes a source disposed in the same layer as the drain; the data line and the source are connected through the via holes formed in the fourth insulating layer and the third insulating layer; the source and the source contact area are connected through the via holes formed in the second insulating layer and the first insulating layer; a material of the source is a metal; and an orthographic projection of the source on the substrate and an orthographic projection of the source contact area on the substrate are located in the orthographic projection range of the data line on the substrate.

In an optional implementation, the first transparent electrode layer includes a first transfer electrode and a second transfer electrode that are integrally formed; the first transfer electrode is connected to the drain, an orthographic projection of the second transfer electrode on the substrate is located in an orthographic projection range of the first scan line, the second scan line, and an area between the first scan line and the second scan line on the substrate:
  a first planarization layer is disposed on one side of the data line that is away from the substrate, and a through hole is formed in the first planarization layer; the through hole penetrates through the first planarization layer, the fourth insulating layer and the third insulating layer, to expose the second transfer electrode; and
  a third transparent electrode layer, a second planarization layer and a pixel electrode layer are disposed in stack on one side of the first planarization layer that is away from the substrate, wherein the third transparent electrode layer is disposed close to the substrate; an orthographic projection of the third transparent electrode layer on the substrate covers an orthographic projection of the through hole on the substrate; the third transparent electrode layer is configured to connect the pixel electrode layer and the second transfer electrode; and the second planarization layer is configured to planarize the through hole.

In an optional implementation, a fifth insulating layer and a common electrode layer are disposed in stack on one side of the pixel electrode layer that is away from the substrate; the fifth insulating layer is disposed close to the substrate; the common electrode layer includes a plurality of strip electrodes; and a material of the common electrode layer is a metal.

In an optional implementation, the active area includes an opening area and a non-opening area; a material of the active layer includes polycrystalline silicon; a buffer layer is further displayed between the substrate and the active layer; and
  an overlap exists between an orthographic projection of an inorganic film layer disposed on one side of the substrate that is close to the first thin film transistor on the substrate and the opening area; and the inorganic film layer includes at least one of the following film layers: the buffer layer, the first insulating layer, and the second insulating layer.

In an optional implementation, an orthographic projection of the second transparent electrode layer on the substrate and an orthographic projection of the first transparent electrode layer on the substrate have an overlap with the opening area respectively.

In an optional implementation, a second thin film transistor is disposed on one side of the buffer layer that is away from the substrate; the second thin film transistor is located in the non-active area; and a material of the active layer of the second thin film transistor includes polycrystalline silicon.

In an optional implementation, a shielding layer is further disposed between the substrate and the active layer; and an orthographic projection of the shielding layer on the substrate covers an orthographic projection of the channel area on the substrate.

In an optional implementation, an orthographic projection of the shielding layer on the substrate covers orthographic projections of the data line, the first scan line, the second scan line, and an area between the first scan line and the second scan line on the substrate.

In an optional implementation, a buffer layer is disposed between the substrate and the active layer; the shielding layer is disposed between the substrate and the buffer layer; and the shielding layer is connected to a second fixed potential input terminal.

In an optional implementation, a material of the shielding layer includes at least one of the followings: molybdenum, aluminum and silver.

The present disclosure provides a displaying apparatus, including the displaying base plate as mentioned above.

The present disclosure provides a manufacturing method for a thin film transistor, including:
  forming an active layer;
  forming a first insulating layer on one side of the active layer; and
  forming a gate layer on one side of the first insulating layer away from the active layer, and performing conductive treatment on the active layer to form a source contact area, a drain contact area and a channel area connecting the source contact area and the drain contact area, wherein the channel area comprises a first channel area, a first resistance area and a second channel area sequentially disposed in a first direction; the gate layer comprises a first gate and a second gate which are separately disposed, an orthographic projection of the first gate on a plane where the active layer is located covers the first channel area, and an orthographic projection of the second gate on a plane where the active layer is located covers the second channel area.

In an optional implementation, a material of the active layer comprises polycrystalline silicon, a gate layer is formed on one side of the first insulating layer that is away from the active layer, and the step of performing conductive treatment on the active layer to form the source contact area, the drain contact area and the channel area connecting the source contact area and the drain contact area includes:
  forming a gate metal layer on one side of the first insulating layer that is away from the active layer;
  patterning the gate metal layer by using a first patterning process to form a single-gate structure, wherein the single-gate structure comprises a first gate, a second gate, and an intermediate portion connecting the first gate and the second gate, which are integrated, an edge of the single-gate structure is indented relative to an edge of first photoresist covering the single-gate structure;

performing a first doping process on the active layer by using the first photoresist as a mask, to form a first conductor area and a second conductor area;

performing dry etching on the first photoresist, such that the edge of the first photoresist is aligned with the edge of the single-gate structure;

performing a second doping process on the active layer by using the etched first photoresist as a mask, to form a second resistance area and a third resistance area, wherein a doping concentration of the second doping process is less than a doping concentration of the first doping process, the second resistance area and the first conductor area form the source contact area, the third resistance area and the second conductor area form the drain contact area;

stripping the first photoresist;

patterning the single-gate structure by using a second patterning process, to form the gate layer;

performing a third doping process on the active layer by using second photoresist covering the gate layer in the second patterning process as a mask, to form the first resistance area, wherein a doping concentration of the third doping process is less than the doping concentration of the first doping process, the first channel area is located between the first resistance area and the second resistance area, and the second channel area is located between the first resistance area and the third resistance area; and stripping the second photoresist to obtain the thin film transistor.

In an optional implementation, a material of the active layer comprises polycrystalline silicon; a gate layer is formed on one side of the first insulating layer that is away from the active layer, and the step of performing conductive treatment on the active layer to form the source contact area, the drain contact area and the channel area connecting the source contact area and the drain contact area includes:

forming a gate metal layer on one side of the first insulating layer that is away from the active layer;

patterning the gate metal layer by using a first patterning process to form a single-gate structure, wherein the single-gate structure comprises a first gate, second gate, an intermediate portion connecting the first gate and the second gate, which are integrated, an edge of the single-gate structure is indented relative to an edge of first photoresist covering the single-gate structure;

performing a first doping process on the active layer by using the first photoresist as a mask, to form a first conductor area and a second conductor area;

stripping the first photoresist;

patterning the single-gate structure by using a third patterning process, to form the gate layer, and performing a fourth doping process on the active layer by using the gate layer as a mask, to form the first resistance area, the second resistance area and a third resistance area, wherein a doping concentration of the fourth doping process is less than the doping concentration of the first doping process; the second resistance area and the first conductor area form the source contact area; the third resistance area and the second conductor area form the drain contact area; the first channel area is located between the first resistance area and the second resistance area; and the second channel area is located between the first resistance area and the third resistance area.

In an optional implementation, the step of patterning the gate metal layer includes:

performing wet etching on the gate metal layer; and the step of patterning the single-gate structure comprises:

performing dry etching on the intermediate portion of the single-gate structure.

The above description is only an overview of the technical solutions of the present disclosure. In order to understand the technical means of the present disclosure more clearly, it may be implemented according to the content of the description. In addition, in order to make the above-mentioned and other objects, features and advantages of the present disclosure more clearly understood, the specific embodiments of the present disclosure are given below.

BRIEF DESCRIPTION OF THE DRAWINGS

To describe the technical solutions in the embodiments or the related art of the present disclosure more clearly, the following briefly introduces the accompanying drawings required for describing the embodiments or the related art. Apparently, the accompanying drawings in the following description show merely some embodiments of the present disclosure, and a person of ordinary skill in the art may still derive other drawings from these accompanying drawings without creative efforts. It should be noted that the scales in the drawings are for illustration only and do not represent practical scales.

DETAILED DESCRIPTION OF THE EMBODIMENTS

In order to make the objectives, technical solutions and advantages of the embodiments of the present disclosure more clearly, the technical solutions in the embodiments of the present disclosure will be described clearly and completely in conjunction with the accompanying drawings in the embodiments of the present disclosure. Apparently, the described embodiments are merely some embodiments, rather than all embodiments, of the present disclosure. Based on the embodiments of the present disclosure, all other embodiments derived by a person of ordinary skill in the art without creative efforts shall fall in the protection scope of the present disclosure.

Figure 1:
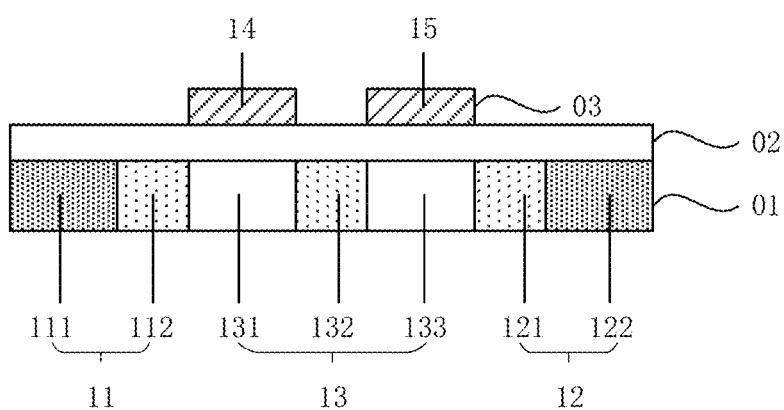
FIG. 1 is a schematic sectional view of a thin film transistor provided by an embodiment of the present disclosure.
Figure 2:
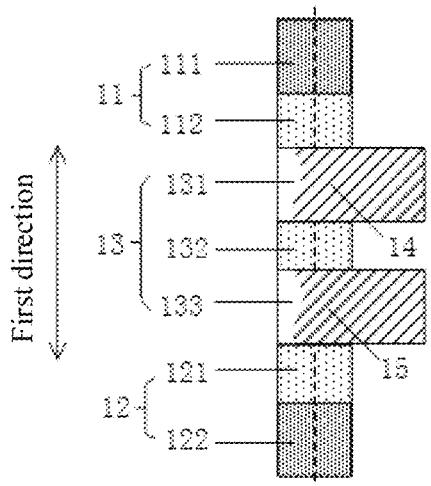
FIG. 2 is a schematic planar view of a thin film transistor provided by an embodiment of the present disclosure.

An embodiment of the present disclosure provides a thin film transistor. FIG. 1 is a schematic sectional view of the thin film transistor provided in this embodiment; and FIG. 2 is a schematic planar view of the thin film transistor provided in this embodiment. FIG. 1 shows a cross-section at a dotted line in FIG. 2. The thin film transistor includes an active layer 01, a first insulating layer 02 and a gate layer 03 which are disposed in stack.

The active layer 01 includes a source contact area 11, a drain contact area 12, and a channel area 13 connecting the source contact area 11 and the drain contact area 12, and the channel area 13 includes a first channel area 131, a first resistance area 132 and a second channel area 133 sequentially disposed in a first direction.

The gate layer 03 includes a first gate and a second gate which are separately disposed; an orthographic projection of the first gate 14 on a plane where the active layer 01 is located covers the first channel area 131, and an orthographic projection of the second gate 15 on a plane where the active layer 01 is located covers the second channel area 133.

It should be noted that, in order to clearly identify the active layer, the first gate 14 and the second gate 15 in FIG. 2 are not completely shown.

In this embodiment, a material of the active layer 01 includes amorphous silicon, polycrystalline silicon, metal oxide or the like, which is limited in this embodiment.

The source contact area 11 is configured to be connected to a source of the thin film transistor; and the source contact area 11 may be formed by conductive treatment on the material of the active layer 01, thereby reducing a contact resistance between the source contact area 11 and the source.

The drain contact area 12 is configured to be connected to a drain of the thin film transistor; and the drain contact area 12 may be formed by conductive treatment on the material of the active layer 01, thereby reducing a contact resistance between the drain contact area 12 and the drain.

The conductive treatment may be achieved by ion doping, plasma treatment and other processes.

Referring to FIG. 2, the first channel area 131, the first resistance area 132 and the second channel area 133 in the channel area 13 are sequentially disposed in the first direction to form an I-type channel. The first channel area 131 and the second channel area 133 may be equivalent to two thin film transistor switches connected in series, and the first resistance area 132 may be equivalent to a resistor connected in series between the two thin film transistor switches. The first resistance area 132 may be formed by performing ion doping, plasma treatment and other processes on the material of the active layer 01. The specific formation process of the source contact area 11, the drain contact area 12 and the first resistance area 132 will be described in detail in subsequent embodiments.

In this embodiment, by arranging the first resistance area 132 between the first channel area 131 and the second channel area 133, it is equivalent to connecting a resistor in series between the two thin film transistor switches, and the arrangement of the resistor may suppress the generation of a leakage current, thereby reducing the leakage current of the thin film transistor and improving the stability of a threshold voltage.

The first gate 14 is configured to receive a signal for controlling the first channel area 131 to be switched on or off.

The second gate 15 is configured to receive a signal for controlling the second channel area 133 to be switched on or off.

In an optional implementation, the signals received by the first gate 14 and the second gate 15 may be the same, which is not limited in this embodiment.

According to the thin film transistor provided in this embodiment, the first resistance area divides the channel area into the first channel area and the second channel area, such that the thin film transistor may be equivalent to two switches connected in series through the resistor, which facilitate suppressing the generation of the leakage current and making the threshold voltage of the thin film transistor more stable. Therefore, the technical solution of the present disclosure may improve the electrical stability of the thin film transistor, improve a voltage retention ratio, and further improve the display effect and reliability of a displaying device. In addition, since the first channel area, the first resistance area and the second channel area are sequentially disposed in the first direction to form the I-type channel, and an area occupied by a pixel unit of the displaying base plate is relatively small, which facilitates improving an aperture ratio of the pixel unit.

In an optional implementation, the material of the active layer 01 includes the polycrystalline silicon. The source contact area 11 includes a second resistance area 112 and a first conductor area 111, the second resistance area 112 being disposed close to the first channel area 131. The drain contact area 12 includes a third resistance area 121 and a second conductor area 122, the third resistance area 121 being disposed close to the second channel area 133.

The first resistance area 132, the second resistance area 112 and the third resistance area 121 are lightly doped areas 132 and formed by a light doping process, and the first conductor area 111 and the second conductor area 122 are heavily doped areas and formed by a heavy doping process. A doping concentration of the first conductor area 111 and the second conductor area 122 is greater than a doping concentration of the first resistance area 132, the second resistance area 112 and the third resistance area 121.

The first conductor area 111 is configured to be connected to a source of the thin film transistor. The second conductor area 122 is configured to be connected to a drain of the thin film transistor.

In this implementation, the second resistance area 112 is disposed between the first conductor area 111 and the first channel area 131, and the third resistance area 121 is disposed between the second conductor area 122 and the second channel area 133, which is equivalent to connect resistors in series between the thin film transistor switches and the conductor areas, thereby further reducing the leakage current and improving the electric stability of the thin film transistor.

Optionally, the first channel area 111, the second resistance area 121, the third resistance area 121 and the second conductor area 122 are sequentially disposed in the first direction, such that an area occupied by the thin film transistor in a pixel unit of the displaying base plate may be further reduced, which is conducive to improve an aperture ratio of the pixel unit.

It is found by the inventors that, in the practical manufacturing process, the manufacturing precision of the first resistance area 132 is relatively high, while the manufacturing precision of the second resistance area 112 and the third resistance area 121 is relatively poor. In the case that the total width of the second resistance area 112 and the third resistance area 121 remains unchanged, it is easy to cause one of the second resistance area 112 and the third resistance area 121 to be too large and the other to be too small. The difference in the two resistance areas results in a large difference in threshold voltage between the first channel area 131 and the second channel area 133.

In order to reduce the difference in the threshold voltage between the first channel area 131 and the second channel area 133, optionally, in the first direction, a width of the first resistance area 132 may be larger than a width of the second resistance area 112 and a width of the third resistance area 121. In this way, by disposing the first resistance area 132 with a larger width, in the case that the total width of the first resistance area 132, the second resistance area 112 and the third resistance area 121 remains unchanged, the effect of suppressing the leakage current may be further improved, which facilitates improving the uniformity of the threshold voltage of each thin film transistor in the displaying base plate, thereby improving the display effect.

In an optional implementation, in the first direction, the width of the first resistance area 132 may be greater than or equal to 1 um and less than or equal to 2.5 um. For example, in the first direction, the width of the first resistance area 132 may be 1.5 um.

In an optional implementation, the width-to-length ratios of the first channel area 131 and the second channel area 133 may be the same, which is not limited in this embodiment.

In the specific implementation, the width-to-length ratio of each of the first channel area 131 and the second channel area 133 may be greater than or equal to 0.5 and less than or equal to 2. For example, the width-to-length ratio of each of the first channel area 131 and the second channel area 133 may be 1.

Figure 3:
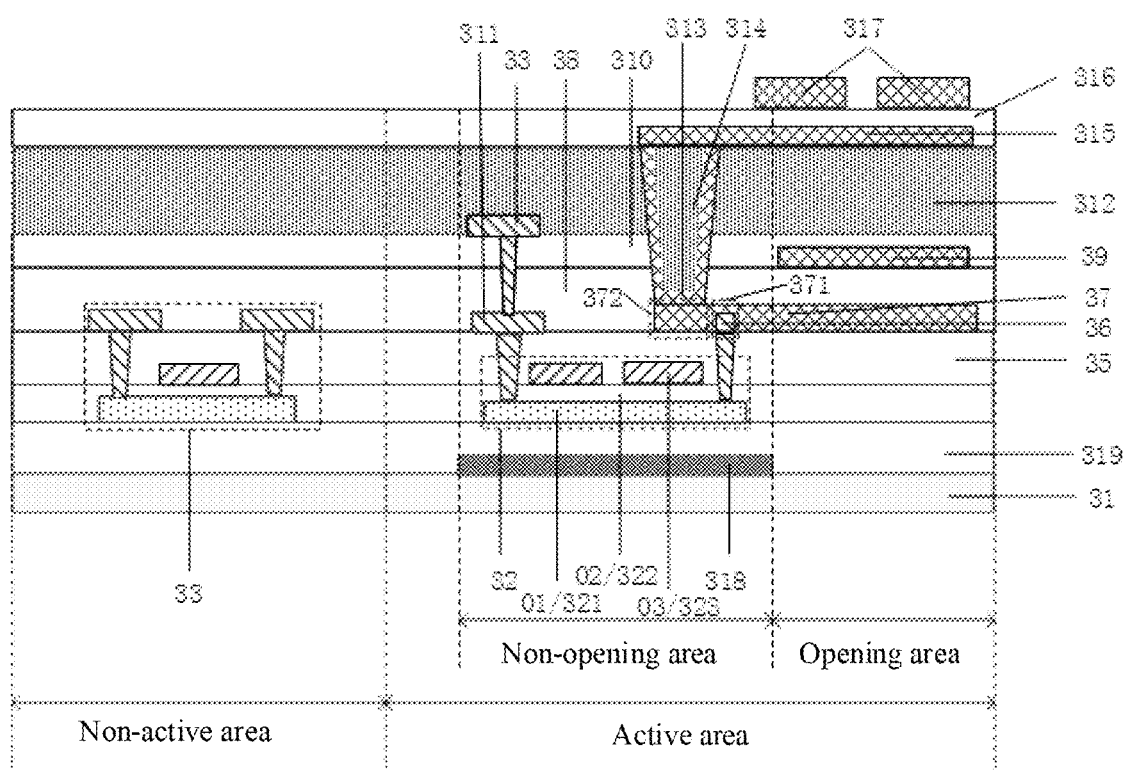
FIG. 3 is a schematic sectional view of a first displaying base plate provided by an embodiment of the present disclosure.

An embodiment of the present disclosure provides a displaying base plate. FIG. 3 is a schematic sectional view of the displaying base plate provided in this embodiment. The displaying base plate includes a substrate 31, and a first thin film transistor 32 disposed on one side of the substrate 31, wherein the first thin film transistor 32 is the thin film transistor according to any one of the above embodiments.

The active layer 01 of the first thin film transistor 32 may be disposed close to the substrate 31 to form a thin film transistor with a top-gate structure, or the gate layer 03 may be disposed close to the substrate 31 to form a thin film transistor with a bottom-gate structure, which is not limited in this embodiment.

According to the displaying base plate provided in this embodiment, since the first thin film transistor is provided with a double-gate structure, the electrical stability is high, and the voltage retention ratio is good, so the display effect and reliability of the displaying base plate may be improved. In addition, since the channel of the first thin film transistor is the I-type channel, the area occupied in the pixel unit of the displaying base plate is relatively small. Therefore, an aperture ratio of the displaying base plate may be increased, and especially for a displaying base plate with higher pixel density, the aperture ration may be significantly increased. The displaying base plate may be applied to a virtual reality (VR) display technology, an augmented reality (AR) display technology, or the like.

As shown in FIG. 3, the displaying base plate includes an active area and a non-active area located at the periphery of the active area, wherein the first thin film transistor 32 may be located in the active area, which is limited in this embodiment.

Figure 4:
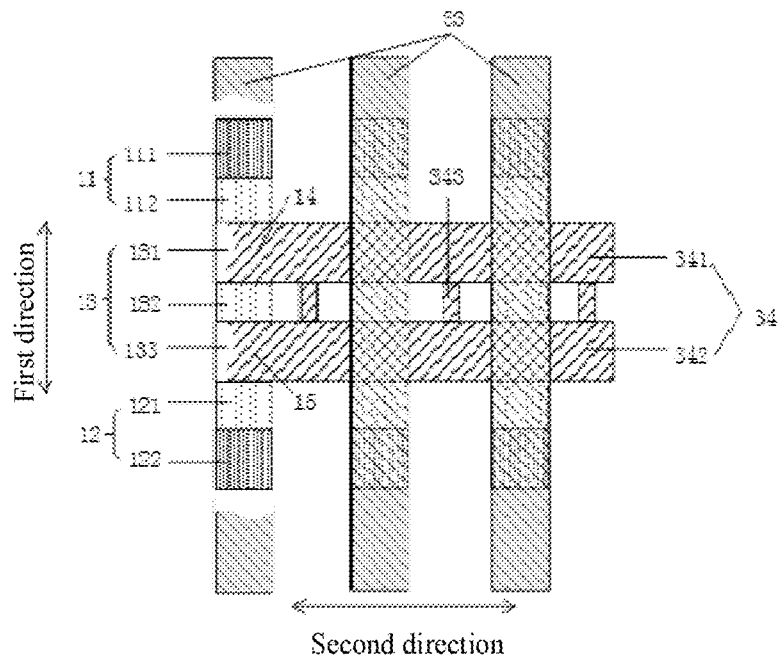
FIG. 4 is a schematic planar view of a displaying base plate provided by an embodiment of the present disclosure.

FIG. 4 is a schematic planar view of an active area of a displaying base plate. The active area further includes a data line 33 and scan lines 34, which are disposed on one side of the substrate 31 that is close to the first thin film transistor 32; the data line 33 extends in the first direction; the scan lines 34 include a first scan line 341 and a second scan line 342, the first gate 14 extends in a second direction intersecting with the first direction to form the first scan line 341, and the second gate 15 extends in the second direction to form the second scan line 342.

In the specific implementation, the second direction may be perpendicular to the first direction, as shown in FIG. 4. Certainly, the second direction may also be other direction intersecting with the first direction, which is not limited in this embodiment.

Referring to FIG. 3, the active layer 01 is connected to the data line 33, as shown in FIG. 3. Specifically, the source contact area in the active layer 01 may be connected to the data line 33 through a via hole.

In order to prevent the channel area 13 in the active layer 01 from occupying the opening area of the active area, referring to FIG. 4, an orthographic projection of the channel area 13 on the substrate 31 may be located in an orthographic projection range of the data line 33 on the substrate 31, such that the aperture ratio of the active area may be increased.

It should be noted that, in order to clearly identify the active layer and the gate layer, one data line 33 on the left of FIG. 4 is not completely shown.

Optionally, as shown in FIG. 4, an orthographic projection of one or more of the first conductor area 111, the second resistance area 112, the third resistance area 121 and the second conductor area 122 on the substrate 31 may also be located in the orthographic projection range of the data line 33 on the substrate 31, which may further increase the aperture ratio of the active area. When the material of the active layer 01 includes the polycrystalline silicon, since the polycrystalline silicon is opaque, the aperture ratio of the active area may be increased significantly by setting an orthographic projection of the entire active layer 01 on the substrate 31 to be in the orthographic projection range of the data line 33 on the substrate 31.

In this implementation, referring to FIG. 4, the adjacent first scan line 341 and the second scan line 342 may be connected by a connecting portion 343 located between the adjacent channel areas 13. The connecting portion 343, the first scan line 341 and the second scan line 342 may be integrated, such that the control signals in the first scan line 341 and the second scan line 342 are the same.

In an optional implementation, referring to FIG. 3, the active layer 01 may be located on one side of the gate layer 03 that is close to the substrate 31, a second insulating layer 35 is disposed on one side of the gate layer 03 that is away from the substrate 31, a drain 36 of the first thin film transistor 32 is disposed on one side of the second insulating layer 35 that is away from the substrate 31, and the drain 36 is connected to the active layer 01 through a via hole. Specifically, the drain 36 is connected to the drain contact area in the active layer 01 through via holes formed in the second insulating layer 35 and the first insulating layer 02.

In the specific implementation, referring to FIG. 3, the drain 36 may also be connected to a first transparent electrode layer 37. The first transparent electrode layer 37 is configured to transfer the via hole connecting the pixel electrode layer 315 to other non-opening areas. An orthographic projection of the via hole through which the drain 36 is connected to the active layer 01 on the substrate may have no overlap with an orthographic projection of the via hole through which the first transparent electrode layer 37 is connected to the pixel electrode layer on the substrate. The first transparent electrode layer 37 plays a role as a transfer layer. The specific structure of the first transparent electrode layer 37 will be described in detail in subsequent embodiments.

A material of the first transparent electrode layer 37 is a transparent conductive material, and the transparent conductive material may include, for example, at least one of transparent metal oxides such as indium tin oxide (ITO), indium zinc oxide (IZO), and graphene oxide.

Since the first transparent electrode layer 37 is transparent, the aperture ratio may not be affected even if the first transparent electrode layer 37 is located in the opening area of the active area.

Figure 5:
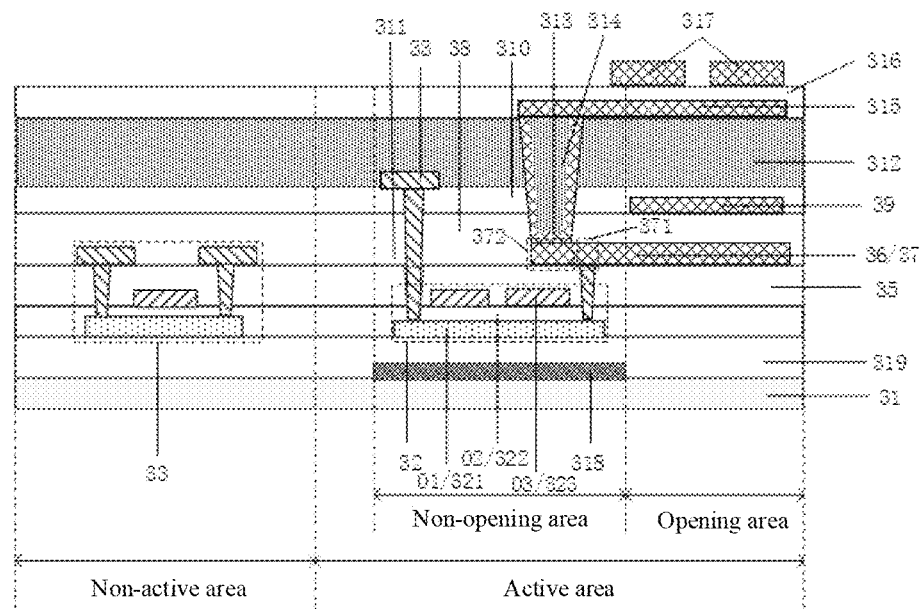
FIG. 5 is a schematic planar view of a displaying base plate provided by an embodiment of the present disclosure.

In order to realize the connection between the drain 36 and the first transparent electrode layer 37, in one implementation, as shown in FIG. 5, the first transparent electrode layer 37 may be multiplexed as the drain 36. That is, the drain 36 and the first transparent electrode layer 37 are the same layer of ITO.

It is founded by the inventors that when the drain 36 is made of a transparent electrode material, the connection between the drain 36 and the active layer 01 (for example, the material is polycrystalline silicon) may have a problem of high contact resistance, which affects the electrical properties of the first thin film transistor 32.

In order to solve the above problems, in another implementation, as shown in FIG. 3, a material of the drain 36 is a metal material, and the first transparent electrode layer 37 is disposed on one side of the drain 36 that is away from the substrate 31. By disposing the drain 36 to be made of a metal material, the contact resistance between the drain 36 and the active layer 01 may be reduced.

In order not to occupy the opening area, an orthographic projection of the drain 36 made of the metal material on the substrate 31 and an orthographic projection of the drain contact area 12 connected to the drain 36 on the substrate 31 may be located in an orthographic projection range of the data line 33 on the substrate 31, respectively, such that the aperture ratio of the active area may be increased.

It is found by the inventors that, as the pixel density of the displaying base plate becomes higher and higher, the area occupied by a single pixel unit becomes smaller and smaller, such that an insufficient pixel space results in a small storage capacitance, which in turn leads to insufficient pixel voltage retention capability, resulting in abnormal display.

In order to increase a pixel storage capacitance, referring to FIG. 3 and FIG. 5, a third insulating layer 38 is disposed on one side of the first transparent electrode layer 37 that is away from the substrate 31, a second transparent electrode layer 39 is disposed on one side of the third insulating layer 38 that is away from the substrate 31, the second transparent electrode layer 39 is connected to a first fixed potential input terminal, and an overlap exists between an orthographic projection of the second transparent electrode layer 39 on the substrate 31 and an orthographic projection of the first transparent electrode layer 37 on the substrate 31.

A material of the second transparent electrode layer 39 may be, for example, a transparent conductive material, which is not limited in this embodiment.

Since an overlap exists between the orthographic projection of the second transparent electrode layer 39 on the substrate 31 and the orthographic projection of the first transparent electrode layer 37 on the substrate 31, a storage capacitor may be formed. In this way, the pixel storage capacitor not only includes a first storage capacitor $C_{st1}$ formed between a pixel electrode layer (315 in FIG. 3) and a common electrode layer (317 in FIG. 3), but also includes a second storage capacitor $C_{st2}$ formed by a second transparent electrode layer 39 and a first transparent electrode layer 37, and a third storage capacitor $C_{st3}$ formed by a second transparent electrode layer 39 and a pixel electrode layer (315 in FIG. 3), and a total pixel storage capacitance is $C_{st1}+C_{st2}+C_{st3}$, thereby ensuring that there is still sufficient storage capacitance in a small pixel space, thus improving the voltage retention rate, and ensuring normal display. Since the first transparent electrode layer 37 is connected to the drain 36, a voltage on the first transparent electrode layer 37 is a pixel voltage, and a voltage on the second transparent electrode layer 39 may be, for example, a common voltage.

It is found by the inventors that, if the data line 33 is disposed between the first transparent electrode layer 37 and the second transparent electrode layer 39, a distance between the data line 33 and the first transparent electrode layer 37 is relatively short, and a coupling capacitance formed between the data line 33 and the first transparent electrode layer 37 is relatively large. When a signal on the data line 33 changes at a high frequency, it will interfere with a signal on the first transparent electrode layer 37, which is likely to cause abnormal pixel display.

In order to solve the above problems of abnormal pixel display, in an optional implementation, as shown in FIG. 3 and FIG. 5, a fourth insulating layer 310 is disposed on one side of the second transparent electrode layer 39 that is away from the substrate 31, and the data line 33 is disposed on one side of the fourth insulating layer 310 that is away from the substrate 31.

In this implementation, the second transparent electrode layer 39 is disposed between the data line 33 and the first transparent electrode layer 37, which may avoid the formation of a coupling capacitance due to the excessively short distance between the data line 33 and the first transparent electrode layer 37. Since the second transparent electrode layer 39 is connected to a fixed potential, even if the signal on the data line 33 changes at a high frequency, the influence of the signal on the data line 33 on the first transparent electrode layer 37 may be shielded, thereby shielding the influence of the data line 33 on the pixel voltage on the pixel electrode layer, so as to realize the normal pixel display.

The connection between the data line 33 and the source contact area in the active layer 01 may be implemented in various ways.

In one implementation, referring to FIG. 5, the data line 33 and the source contact area in the active layer 01 may be connected through via holes formed in the fourth insulating layer 310, the third insulating layer 38, the second insulating layer 35 and the first insulating layer 02.

In another implementation, as shown in FIG. 3, the displaying base plate may further include a source 311 disposed in the same layer as the drain 36. The data line 33 and the source 311 are connected through the via holes formed in the fourth insulating layer 310 and the third insulating layer 38. The source 311 and the source contact area 11 are connected through the via holes formed in the second insulating layer 35 and the first insulating layer 02. Since the source 311 is configured to implement the connection between the data line 33 and the source contact area 11, the difficulty of the opening process may be reduced and the yield may be increased.

A material of the source 311 may be a metal. In order not to occupy the opening area, an orthographic projection of the source 311 on the substrate 31 and an orthographic projection of the source contact area 11 connected to the source 311 on the substrate 31 may be respectively located in an orthographic projection range of the data line 33 on the substrate 31, such that the aperture ratio of the active area may be increased.

In the specific implementation, the material of the source 311 may be the same as the material of the drain 36, which is not limited in this embodiment.

In an optional implementation, as shown in FIG. 3 and FIG. 5, the first transparent electrode layer 37 includes a first transfer electrode 371 and a second transfer electrode 372 that are integrally formed, the first transfer electrode 371 is connected to the drain 36, an orthographic projection of the second transfer electrode 372 on the substrate 31 is located on an orthographic projection range of the first scan line 341, the second scan line 342, and an area between the first scan line 341 and the second scan line 342 on the substrate. As shown in FIG. 3, when the material of the drain 36 is a metal material, the first transfer electrode 371 is disposed on one side of the drain 36 that is away from the substrate 31, and is in contact connection (i.e., lap joint) with the drain 36, and as shown in FIG. 5, the first transfer electrode 371 is multiplexed as the drain 36.

In this implementation, orthographic projections of the first transfer electrode 371, the drain 36 and the via hole through the drain 36 is connected to the active layer 01 on the substrate 31 may overlap with each other. The second transfer electrode 372 is connected to the pixel electrode layer (315 in FIG. 3) through a via hole, and an overlap exists between an orthographic projection of the second transfer electrode 372 on the substrate 31 and an orthographic projection of the pixel electrode layer 315 on the substrate 31. In this way, by means of the integrated first transfer electrode 371 and second transfer electrode 372, the via hole connecting the pixel electrode layer may be transferred to a continuous non-opening area with a larger area, such as a scan line area. Since the width of the scan line area (a dimension in the first direction) is larger than the width of the data line 33 (a dimension in the second direction), that is, the area of the continuous non-opening area is larger, a larger-sized via hole may be made to reduce the process difficulty, without affecting the aperture ratio. The scan line area includes an area corresponding to the first scan line 341, an area corresponding to the second scan line 342, and an area between the first scan line 341 and the second scan line 342.

In this way, by disposing the first transparent electrode layer 37 with a transfer function, the problem of insufficient wiring space caused by the small pixel space of the displaying base plate with high pixel density may be solved.

Referring to FIG. 3 and FIG. 5, a first planarization layer 312 may be disposed on one side of the data line 33 that is away from the substrate 31, and a through hole is formed in the first planarization layer 312. The through hole penetrates through the first planarization layer 312, the fourth insulating layer 310 and the third insulating layer 38, the through hole being configured to expose the second transfer electrode 372. A third transparent electrode layer 313, a second planarization layer 314 and a pixel electrode layer 315 may be disposed in stack on one side of the first planarization layer 312 that is away from the substrate 31, wherein the third transparent electrode layer 313 is disposed close to the substrate 31, an orthographic projection of the third transparent electrode layer 313 on the substrate 31 covers an orthographic projection of the through hole on the substrate 31, the third transparent electrode layer 313 is configured to connect the pixel electrode layer 315 and the second transfer electrode 372, and the second planarization layer 314 is configured to planarize the through hole in the first planarization layer 312.

The through hole in the first planarization layer 312 is planarized by the second planarization layer 314 disposed in the through hole, such that a deep hole structure on the first planarization layer 312 and a light leakage caused by the deep hole structure are eliminated. Therefore, it is not necessary to provide a large light shielding layer to shield a leaked light, thereby increasing an aperture ratio of the active area. Transparent pixel electrodes may be disposed at the position where the through hole is planarized, thereby improving the transmittance of the active area.

In order to form a horizontal electric field, a fifth insulating layer 316 and a common electrode layer 317 are disposed in stack on one side of the pixel electrode layer 315 that is away from the substrate 31, wherein the fifth insulating layer 316 is disposed close to the substrate 31.

A material of the third transparent electrode layer 313 may be, for example, a transparent conductive material, a material of the pixel electrode layer 315 may be, for example, a transparent conductive material, and a material of the common electrode layer 317 may be, for example, a transparent conductive material, which is not limited in this embodiment.

Since the pixel electrode layer 315 is disposed on a flat surface, a distance between the pixel electrode layer 315 and the common electrode layer may be kept consistent, such that the electric field is uniform and liquid crystals are deflected normally, thereby avoiding the light leakage caused by abnormal liquid crystal deflection. Further, it is not necessary to dispose a large light shielding layer to shield the leaked light, thereby increasing a pixel aperture ratio of the active area.

In addition, by disposing the third transparent electrode layer 313 and the pixel electrode layer 315, respectively, the problem that the contact resistance is too large when only the third transparent electrode layer 313 is disposed may be solved. The problem of large contact resistance may be solved by lap-jointing another pixel electrode layer 315 on one side of the second planarization layer 314 that is away from the substrate.

The common electrode layer 317 may include a plurality of strip electrodes, which may form a horizontal electric field with the pixel electrode layer 315. The width and spacing of the strip electrodes may be designed according to practical requirements, which is not limited in this embodiment. In order to reduce the light crosstalk between adjacent pixels, a material of the common electrode layer 317 may be a metal.

In order to prevent the channel area 13 of the first thin film transistor 32 located in the active area from being affected by backlight illumination, resulting in changes in the characteristics of the thin film transistor, referring to FIG. 3 and FIG. 5, a shielding layer 318 may further be disposed between the substrate 31 and the active layer 01. An orthographic projection of the shielding layer 318 on the substrate 31 covers an orthographic projection of the channel area 13 in the active layer 01 on the substrate 31.

Figure 7:
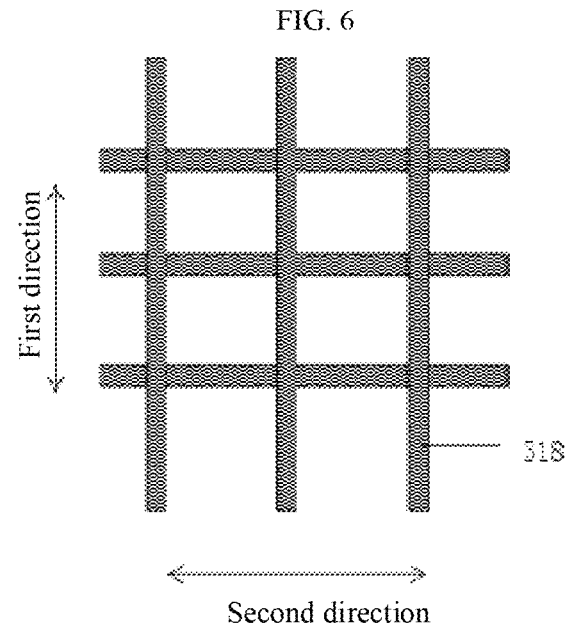
FIG. 7 is a schematic planar view of a shielding layer provided by an embodiment of the present disclosure.

In an optional implementation, as shown in FIG. 7, an orthographic projection of the shielding layer 318 on the substrate 31 may cover orthographic projections of the data line 33, the first scan line 341, the second scan line 342, and an area between the first scan line 341 and the second scan line 342 on the substrate 31. That is, the shielding layer 318 is of a mesh structure. The shielding layer 318 of the mesh structure may increase the area of the shielding layer 318 without affecting the aperture ratio, such that more backlight may be reflected and the transmittance of the backlight may be improved.

When the material of the active layer 01 includes polycrystalline silicon, a buffer layer 319 may also be disposed between the substrate 31 and the active layer 01. Referring to FIG. 3 and FIG. 5, the shielding layer 318 may be disposed between the substrate 31 and the buffer layer 319.

It is found by the inventors that, if the buffer layer 319 is not connected to a fixed potential, induced charges may occur under the influence of an external electric field, thereby causing a shift in the threshold voltage of the first thin film transistor 32 and poor display uniformity.

In order to solve the above problems, in an optional implementation, the shielding layer 318 may be connected to a second fixed potential input terminal. The second fixed potential input terminal may be, for example, a fixed potential input terminal such as a power supply voltage. This implementation may prevent the display abnormality caused by the shift in the threshold voltage of the thin film transistor, and improve the display uniformity.

In order to further improve the backlight utilization rate, a material of the shielding layer 318 may be a metal material with high reflectivity, and the metal material may include at least one of the followings: molybdenum, aluminum, silver and tin. The shielding layer 318 made of a high reflectivity material may reflect the backlight irradiated on the shielding layer 318 back, and the reflected backlight may be reused, thereby improving the transmittance of the backlight.

The material of the shielding layer 318 may be, for example, Al/top TIN, Al/top Mo, Al alloy/top TIN or Al alloy/top Mo, and these materials have good high-temperature stability, and constant reflectivity before and after high temperature annealing.

Figure 6:
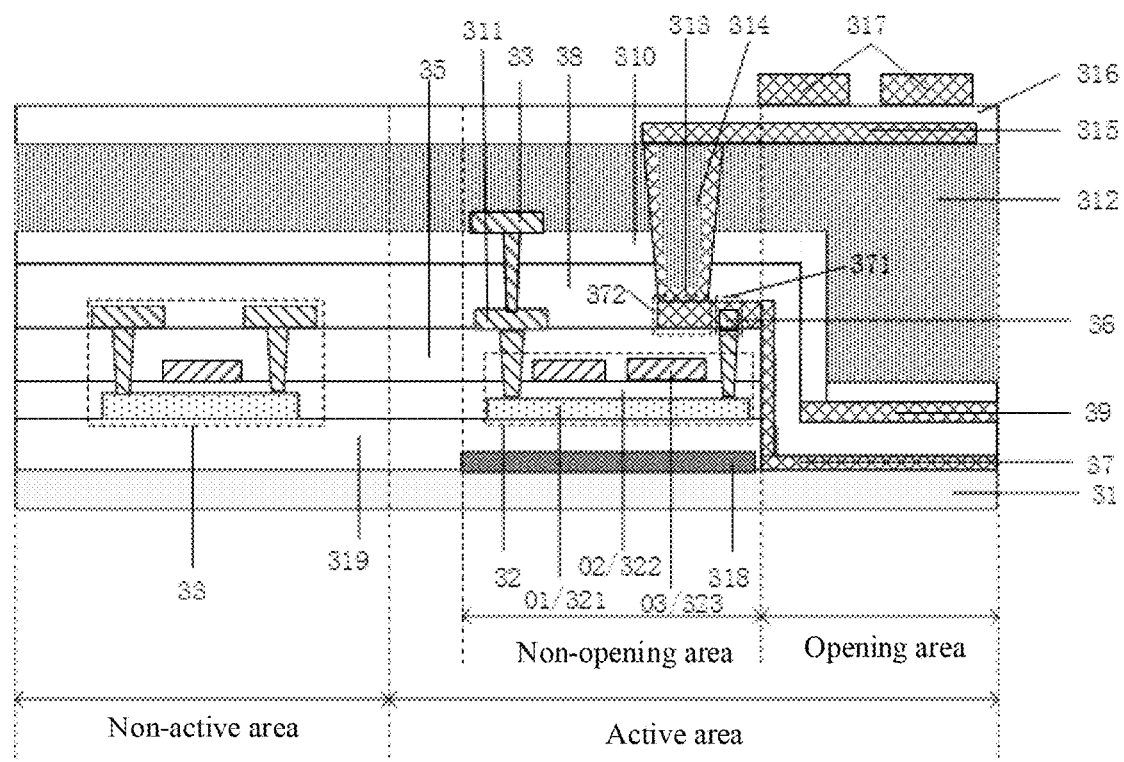
FIG. 6 is a schematic planar view of a displaying base plate provided by an embodiment of the present disclosure.

Referring to FIG. 6, the active area includes an opening area and a non-opening area. There is no overlap exists between an orthographic projection of an inorganic film layer disposed on one side of the substrate 31 that is close to the first thin film transistor 32 on the substrate 31 and the opening area, and the inorganic film layer includes at least one of the following film layers: the buffer layer 319, the first insulating layer 322, and the second insulating layer 35. By removing the inorganic film layer in the opening area, the transmittance of the film layer in the opening area may be improved.

Referring to FIG. 3, FIG. 5 and FIG. 6, an orthographic projection of the second transparent electrode layer 39 on the substrate 31 and an orthographic projection of the first transparent electrode layer 37 on the substrate 31 respectively have an overlap with the opening area.

In an optional implementation, referring to FIG. 3, FIG. 5 and FIG. 6, a second thin film transistor 33 is disposed on one side of the buffer layer 319 that is away from the substrate plate 31, and the second thin film transistor 33 is located in the non-active area.

A material of an active layer of the second thin film transistor 33 may include polycrystalline silicon, which is limited in this embodiment.

In order to simplify the process steps, the structures of the second thin film transistor 33 and the first thin film transistor 32 may be the same, and may be formed at the same time.

It is found by the inventors that, as the pixel density of the displaying base plate becomes higher and higher, the area occupied by a single pixel unit becomes smaller and smaller, such that an insufficient pixel space results in a small storage capacitance, which in turn leads to insufficient pixel voltage retention capability, resulting in abnormal display.

Figure 8:
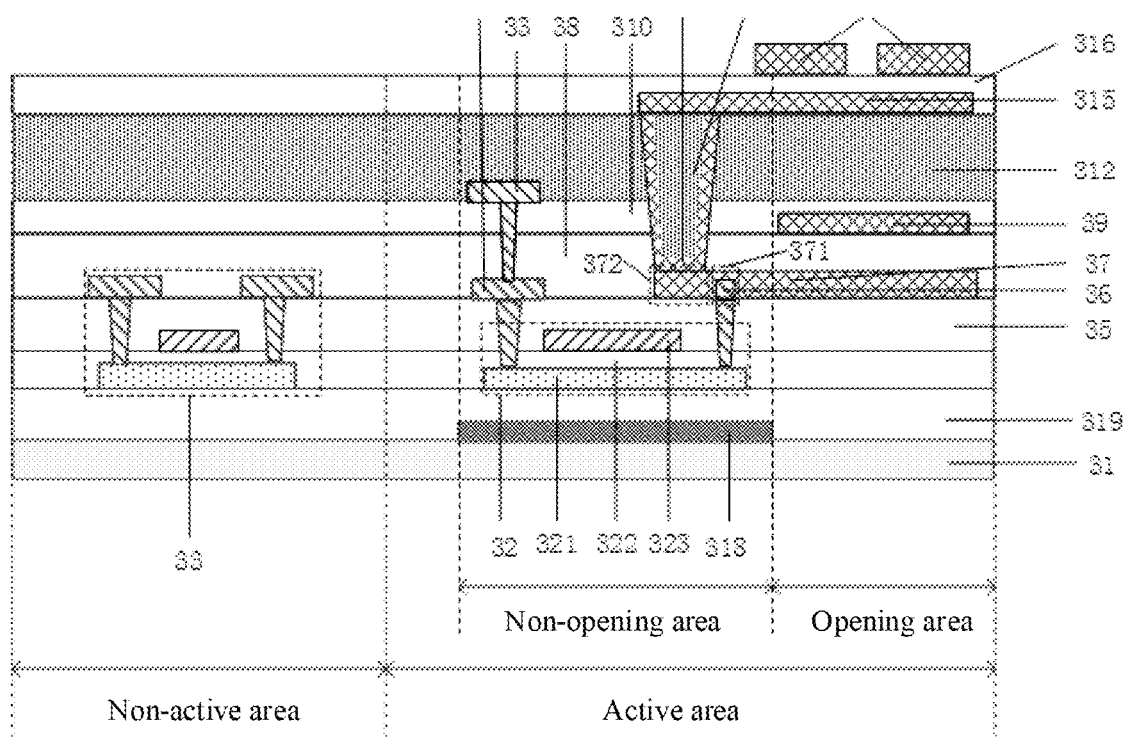
FIG. 8 is a schematic planar view of a displaying base plate provided by an embodiment of the present disclosure.

In order to solve the above problems, another embodiment of the present disclosure provides a displaying base plate. Referring to FIG. 8, the displaying base plate includes: a substrate 31, a first thin film transistor 32 disposed on one side of the substrate 31, a third insulating layer 38 disposed on one side of the first thin film transistor 32 that is away from the substrate 31, a second transparent electrode layer 39 disposed on one side of the third insulating layer 38 that is away from the substrate 31, a first planarization layer 312 disposed on one side of the second transparent electrode layer 39 that is away from the substrate 31, and a pixel electrode layer 315 disposed on one side of the first planarization layer 312 that is away from the substrate 31.

The second transparent electrode layer 39 is connected to a first fixed potential input terminal, and an overlap exists between an orthographic projection of the second transparent electrode layer 39 on the substrate 31 and an orthographic projection of the pixel electrode layer 315 on the substrate 31.

The pixel electrode layer 315 is connected to the active layer of the first thin film transistor 32, so a voltage on the pixel electrode layer 315 is a pixel voltage. The specific connection manner between the pixel electrode layer 315 and the active layer will be introduced in subsequent embodiments.

A voltage on the second transparent electrode layer 39 may be, for example, a common voltage, which is not limited in this embodiment.

According to the displaying base plate provided in this embodiment, since an overlap exists between the orthographic projection of the second transparent electrode layer 39 on the substrate 31 and the orthographic projection of the pixel electrode layer 315 on the substrate 31, a storage capacitor may be formed. In this way, the pixel storage capacitor not only includes a first storage capacitor $C_{st1}$ formed between a pixel electrode layer 315 and a common electrode layer (317 in FIG. 8), but also includes a second storage capacitor $C_{st2}$ formed by a second transparent electrode layer 39 and a pixel electrode layer 315, and a total pixel storage capacitance is $C_{st1}+C_{st2}$, thereby ensuring that there is still sufficient storage capacitance in a small pixel space, thus improving the voltage retention rate, and ensuring normal display.

A material of the second transparent electrode layer 39 may be, for example, a transparent conductive material, and a material of the pixel electrode layer 315 may be, for example, a transparent conductive material, which is not limited in this embodiment. The transparent conductive material may include, for example, at least one of transparent metal oxides such as indium tin oxide (ITO), indium zinc oxide (IZO), and graphene oxide.

As shown in FIG. 8, the displaying base plate includes an active area and a non-active area located at the periphery of the active area, wherein the first thin film transistor 32 may be located in the active area, which is limited in this embodiment.

The first thin film transistor 32 may be of a single-gate structure, a double-gate structure or a multi-gate structure, etc., which is not limited in this embodiment.

In an optional implementation, the first thin film transistor 32 is the thin film transistor described in any of the above embodiments, that is, the first thin film transistor 32 is of a double-gate structure, as shown in FIG. 3.

In this implementation, since the first thin film transistor 32 is provided with a higher electric stability and a better voltage retention ratio, the display effect and reliability of the displaying base plate may be improved. In addition, since the channel of the first thin film transistor 32 is the I-type channel, the area occupied in the pixel unit of the displaying base plate is relatively small. Therefore, an aperture ratio of the displaying base plate may be increased, and especially for the displaying base plate with higher pixel density, the aperture ratio may be significantly increased. The displaying base plate may be applied to a virtual reality (VR) display technology, an augmented reality (AR) display technology, or the like.

The first thin film transistor 32 may be of a bottom-gate structure, a top-gate structure, etc., which is not limited in this embodiment.

In an optional implementation, referring to FIG. 3 and FIG. 8, the first thin film transistor 32 may include an active layer 321, a first insulating layer 322 and a gate layer 323 which are disposed in stack. The active layer 321 may be disposed close to the substrate 31, that is, the first thin film transistor 32 is of a top-gate structure.

The active layer 321 may include a source contact area, a drain contact area, and a channel area located between the source contact area and the drain contact area. A material of the active layer 321 includes amorphous silicon, polycrystalline silicon, metal oxide, etc., which is limited in this embodiment.

When the first thin film transistor 32 is of the double-gate structure, the active layer 321, the structures of the active layer 321, the first insulating layer 322 and the gate layer 323 may be the same as those of the active layer 01, the first insulating layer 02 and the gate layer 03 in the thin film transistor described in any of the above embodiments, respectively, which will not be repeated here.

Referring to FIG. 3 and FIG. 8, the drain 36 is connected to the active layer 321 through a via hole. Specifically, the drain 36 is connected to the drain contact area in the active layer 321 through a via hole.

Referring to FIG. 4, the active area of the displaying base plate may further include a data line 33 and scan lines 34, which are disposed on one side of the substrate 31 that is close to the first thin film transistor 32, wherein the data line 33 extends in a first direction, and the scan lines 34 extend in a second direction intersecting with the first direction. An orthographic projection of the data line 33 on the substrate 31 and an orthographic projection of the scan lines 34 on the substrate 31 cover an orthographic projection of a channel area of the active layer 321 on the substrate 31, respectively.

In the specific implementation, the second direction may be perpendicular to the first direction, as shown in FIG. 4.

Certainly, the second direction may also be another direction intersecting with the first direction, which is not limited in this embodiment.

When the first thin film transistor 32 is the thin film transistor described in any of the above embodiments, as shown in FIG. 4, the scan lines 34 include a first scan line 341 and a second scan line 342. The first gate 14 extends in the second direction to form the first scan line 341, and the second gate 15 extends in the second direction to form the second scan line 342.

Referring to FIG. 3 and FIG. 8, the active layer 321 is connected to the data line 33. Specifically, the source contact area in the active layer 321 may be connected to the data line 33 through a via hole.

In order to prevent the channel area in the active layer 321 from occupying the opening area of the active area, an orthographic projection of the channel area (13 in FIG. 4) of the active layer 321 on the substrate 31 may be located in an orthographic projection range of the data line 33 on the substrate 31, such that the aperture ratio of the active area may be increased.

It should be noted that, in order to clearly identify the active layer and the gate layer, one data line 33 on the left of FIG. 4 is not completely shown.

In order to increase the aperture ratio of the active area, the orthographic projection of the active layer 321 on the substrate 31 may be located in the orthographic projection range of the data line 33 on the substrate 31. When the first thin film transistor 32 is the thin film transistor described in any of the above embodiments, as shown in FIG. 4, an orthographic projection of one or more of the first conductor area 111, the second resistance area 112, the third resistance area 121 and the second conductor area 122 on the substrate 31 may also be located in the orthographic projection range of the data line 33 on the substrate 31, which may further increase the aperture ratio of the active area.

When the material of the active layer 01 includes polycrystalline silicon, since the polycrystalline silicon is opaque, the aperture ratio of the active area may be increased significantly by setting an orthographic projection of the entire active layer 01 on the substrate 31 to be in the orthographic projection range of the data line 33 on the substrate 31.

When the first thin film transistor 32 is the thin film transistor described in any of the above embodiments, referring to FIG. 4, the adjacent first scan line 341 and second scan line 342 are connected by a connecting portion 343 located between the adjacent channel areas 13. The connecting portion 343, the first scan line 341 and the second scan line 342 may be integrated, such that the control signals in the first scan line 341 and the second scan line 342 are the same.

In an optional implementation, referring to FIG. 3 and FIG. 8, a second insulating layer 35 may further be disposed on one side of the first thin film transistor 32 that is away from the substrate 31, and the drain 36 of the first thin film transistor 32 is disposed on one side of the second insulating layer 35 that is away from the substrate 31. The drain 36 may also be connected to the first transparent electrode layer 37. A third insulating layer 38 is disposed on one side of the first transparent electrode layer 37 that is away from the substrate 31.

The first transparent electrode layer 37 is configured to transfer the via hole connecting the pixel electrode layer 315 to other non-opening areas. There is no overlap exists between an orthographic projection of the via hole through which the drain 36 is connected to the active layer 321 on the substrate and an orthographic projection of the via hole through which the first transparent electrode layer 37 is connected to the pixel electrode layer on the substrate. The first transparent electrode layer 37 plays a role as a transfer layer. The specific structure of the first transparent electrode layer 37 will be described in detail in subsequent embodiments.

The material of the first transparent electrode layer 37 may be, for example, a transparent conductive material, which is not limited in this embodiment. Since the first transparent electrode layer 37 is transparent, the aperture ratio may not be affected even if the first transparent electrode layer 37 is located in the opening area of the active area.

Referring to FIG. 3 and FIG. 8, the drain 36 is connected to the active layer 321 through a via hole. Specifically, the drain 36 is connected to the drain contact area in the active layer 321 through via holes formed in the second insulating layer 35 and the first insulating layer 322.

In order to implement the connection between the drain 36 and the first transparent electrode layer 37, in an implementation, as shown in FIG. 5, the first transparent electrode layer 37 may be multiplexed as the drain 36. That is, the drain 36 and the first transparent electrode layer 37 are the same layer of ITO.

It is founded by the inventors that, when the drain 36 is made of a transparent electrode material, the connection between the drain 36 and the active layer 321 (for example, the material is polycrystalline silicon) may have a problem of high contact resistance, which affects the electrical properties of the first thin film transistor 32.

In order to solve the above problems, in another implementation, as shown in FIG. 3 and FIG. 8, a material of the drain 36 is a metal material, and the first transparent electrode layer 37 is disposed on one side of the drain 36 that is away from the substrate 31. By disposing the drain 36 made of a metal material, the contact resistance between the drain 36 and the active layer 321 may be reduced.

In order not to occupy the opening area, the orthographic projection of the drain 36 made of a metal material on the substrate 31 and an orthographic projection of the drain contact area connected to the drain 36 on the substrate 31 may be located in an orthographic projection range of the data line on the substrate 31, such that the aperture ratio of the active area may be increased.

In order to increase a storage capacitance, referring to FIG. 3, FIG. 5 and FIG. 8, an overlap exists between the orthographic projection of the second transparent electrode layer 39 on the substrate 31 and the orthographic projection of the first transparent electrode layer 37 on the substrate 31. Since an overlap exists between the orthographic projection of the second transparent electrode layer 39 on the substrate 31 and the orthographic projection of the first transparent electrode layer 37 on the substrate 31, and the second transparent electrode layer 39 is connected to the first fixed potential input terminal, the second transparent electrode layer 39 and the first transparent electrode layer 37 may form a third storage capacitor Co to further increase the pixel storage capacitance. A total pixel storage capacitance is $C_{st1}+C_{st2}+C_{st3}$, so as to ensure that there is still sufficient storage capacitance in a small pixel space, thereby improving the voltage retention rate, and ensuring normal display. Since the first transparent electrode layer 37 is connected to the drain 36, a voltage on the first transparent electrode layer 37 is a pixel voltage, and a voltage on the second transparent electrode layer 39 may be, for example, a common voltage.

It is found by the inventors that, if the data line 33 is disposed between the first transparent electrode layer 37 and the second transparent electrode layer 39, a distance between the data line 33 and the first transparent electrode layer 37 is relatively short, and a coupling capacitance formed between the data line 33 and the first transparent electrode layer 37 is relatively large. When a signal on the data line 33 changes at a high frequency, it will interfere with a signal on the first transparent electrode layer 37, which is likely to cause abnormal display of pixels.

In order to solve the above problems of abnormal pixel display, in an optional implementation, as shown in FIG. 3, FIG. 5 and FIG. 8, a fourth insulating layer 310 is disposed on one side of the second transparent electrode layer 39 that is away from the substrate 31, the data line 33 is disposed on one side of the fourth insulating layer 310 that is away from the substrate 31, and a first planarization layer 312 is disposed on one side of the data line 33 that is away from the substrate 31.

In this implementation, the second transparent electrode layer 39 is disposed between the data line 33 and the first transparent electrode layer 37, which may avoid the formation of a coupling capacitance due to the excessively short distance between the data line 33 and the first transparent electrode layer 37. Since the second transparent electrode layer 39 is connected to a fixed potential, even if the signal on the data line 33 changes at a high frequency, the influence of the signal on the data line 33 on the first transparent electrode layer 37 may also be shielded, thereby shielding the influence of the data line 33 on the pixel voltage on the pixel electrode layer, so as to implement the normal display of the pixels.

The connection between the data line 33 and the source contact area in the active layer 321 may be implemented in various ways.

In an implementation, referring to FIG. 5, the data line 33 and the source contact area in the active layer 321 may be connected through via holes formed in the fourth insulating layer 310, the third insulating layer 38, the second insulating layer 35 and the first insulating layer 322.

In another implementation, as shown in FIG. 3 and FIG. 8, the displaying base plate may further include a source 311 disposed in the same layer as the drain 36. The data line 33 and the source 311 are connected through the via holes formed in the fourth insulating layer 310 and the third insulating layer 38. The source 311 and the source contact area are connected through the via holes formed in the second insulating layer 35 and the first insulating layer 322. Since the source 311 is configured to implement the connection between the data line 33 and the source contact area, the difficulty in the opening process may be reduced and the yield may be increased.

A material of the source 311 may be a metal. In order not to occupy the opening area, the orthographic projection of the source 311 on the substrate 31 and the orthographic projection of the source contact area connected to the source 311 on the substrate 31 may be located in the orthographic projection range of the data line 33 on the substrate 31, respectively, such that the aperture ratio of the active area may be increased.

In the specific implementation, the material of the source 311 may be the same as the material of the drain 36, which is not limited in this embodiment.

In an optional implementation, as shown in FIG. 3, FIG. 5 and FIG. 8, the first transparent electrode layer 37 includes a first transfer electrode 371 and a second transfer electrode 372 that are integrally formed, the first transfer electrode 371 is connected to the drain 36, and an orthographic projection of the second transfer electrode 372 on the substrate 31 is located in the orthographic projection range of the scan line 34 on the substrate 31. When the first thin film transistor 32 is the thin film transistor described in any of the above embodiments, the orthographic projection of the second transfer electrode 372 on the substrate 31 is located in an orthographic projection of the first scan line 341, the second scan line 342 and the area between the first scan line 341 and the second scan line 342 on the substrate 31. As shown in FIG. 3 and FIG. 8, when the material of the drain 36 is a metal material, the first transfer electrode 371 is disposed on one side of the drain 36 that is away from the substrate 31, and is in contact connection (i.e., lap joint) with the drain 36; and as shown in FIG. 5, the first transfer electrode 371 is multiplexed as the drain 36.

In this implementation, orthographic projections of the first transfer electrode 371, the drain 36 and the via hole through which the drain 36 is connected to the active layer 321 on the substrate 31 may overlap with each other. The second transfer electrode 372 is connected to the pixel electrode layer 315 through a via hole, and an overlap exists between the orthographic projection of the second transfer electrode 372 on the substrate 31 and the orthographic projection of the pixel electrode layer 315 on the substrate 31. In this way, by means of the integrated first transfer electrode 371 and second transfer electrode 372, the via hole connecting the pixel electrode layer may be transferred to a continuous non-opening area with a larger area, such as a scan line area. Since the width of the scan line area (a dimension in the first direction) is larger than the width of the data line 33 (a dimension in the second direction), that is, the area of the continuous non-opening area is larger, a larger-sized via hole may be made to reduce the process difficulty, without affecting the aperture ratio.

When the first thin film transistor 32 is the thin film transistor described in any of the above embodiments, the scan line area includes an area corresponding to the first scan line 341, an area corresponding to the second scan line 342, and an area between the first scan line 341 and the second scan line 342.

In this way, by disposing the first transparent electrode layer 37 with a transfer function, the problem of insufficient wiring space caused by the small pixel space of the displaying base plate with high pixel density may be solved.

Referring to FIG. 3, FIG. 5 and FIG. 8, a through hole is formed in the first planarization layer 312. The through hole penetrates through the first planarization layer 312, the fourth insulating layer 310 and the third insulating layer 38, the through hole being configured to expose the second transfer electrode 372. A third transparent electrode layer 313, a second planarization layer 314 and a pixel electrode layer 315 may be disposed in stack on one side of the first planarization layer 312 that is away from the substrate 31, wherein the third transparent electrode layer 313 is disposed close to the substrate 31, an orthographic projection of the third transparent electrode layer 313 on the substrate 31 covers an orthographic projection of the through hole on the substrate 31, the third transparent electrode layer 313 is configured to connect the pixel electrode layer 315 and the second transfer electrode 372, and the second planarization layer 314 is configured to planarize the through hole in the first planarization layer 312.

The through hole in the first planarization layer 312 is planarized by the second planarization layer 314 disposed in the through hole, such that a deep hole structure on the first planarization layer 312 and the light leakage caused by the deep hole structure are eliminated. Therefore, it is not necessary to provide a large light shielding layer to shield the leaked light, thereby increasing an aperture ratio of the active area. Transparent pixel electrodes may be disposed at the position where the through hole is planarized, thereby improving the transmittance of the active area.

In order to form a horizontal electric field, a fifth insulating layer 316 and a common electrode layer 317 are disposed in stack on one side of the pixel electrode layer 315 that is away from the substrate 31, wherein the fifth insulating layer 316 is disposed close to the substrate 31.

A material of the third transparent electrode layer 313 may be, for example, a transparent conductive material, and a material of the common electrode layer 317 may be, for example, a transparent conductive material, which is not limited in this embodiment.

Since the pixel electrode layer 315 is disposed on a flat surface, a distance between the pixel electrode layer 315 and the common electrode layer may be kept consistent, such that the electric field is uniform and liquid crystals are deflected normally, thereby avoiding the light leakage caused by abnormal liquid crystal deflection. Further, it is not necessary to provide a large light shielding layer to shield the leaked light, thereby increasing a pixel aperture ratio of the active area.

In addition, by disposing the third transparent electrode layer 313 and the pixel electrode layer 315, respectively, the problem that the contact resistance is too large when only the third transparent electrode layer 313 is disposed may be solved. The problem of large contact resistance may be solved by lap-jointing another pixel electrode layer 315 on one side of the second planarization layer 314 that is away from the substrate.

The common electrode layer 317 may include a plurality of strip electrodes, which may form a horizontal electric field with the pixel electrode layer 315. The width and spacing of the strip electrodes may be designed according to practical requirements, which is not limited in this embodiment. In order to reduce the light crosstalk between adjacent pixels, the material of the common electrode layer 317 may be a metal.

In order to prevent the channel area of the first thin film transistor 32 located in the active area from being affected by backlight illumination, resulting in changes in the characteristics of the thin film transistor, referring to FIG. 3, FIG. 5 and FIG. 8, a shielding layer 318 may further be disposed between the substrate 31 and the active layer 321. An orthographic projection of the shielding layer 318 on the substrate 31 covers an orthographic projection of the channel area in the active layer 321 on the substrate 31.

In an optional implementation, as shown in FIG. 7, an orthographic projection of the shielding layer 318 on the substrate 31 may cover the orthographic projections of the data line 33 and the scan lines 33 on the substrate 31. That is, the shielding layer 318 is of a mesh structure.

When the first thin film transistor 32 is the thin film transistor described in any of the above embodiments, the orthographic projection of the shielding layer 318 on the substrate 31 may cover the orthographic projections of the data line 33, the first scan line 341, the second scan line 342 and the area between the first scan line 341 and the second scan line 342 on the substrate 31.

The shielding layer 318 of the mesh structure may increase the area of the shielding layer 318 without affecting the aperture ratio, such that more backlight may be reflected and the transmittance of the backlight may be improved.

When the material of the active layer 321 includes polycrystalline silicon, referring to FIG. 3, FIG. 5 and FIG. 8, a buffer layer 319 may also be disposed between the substrate 31 and the active layer 321, and the shielding layer 318 may be disposed between the substrate 31 and the buffer layer 319.

It is found by the inventors that, when the buffer layer 319 is not connected to a fixed potential, induced charges may occur under the influence of an external electric field, thereby causing a shift in the threshold voltage of the first thin film transistor 32 and poor display uniformity.

In order to solve the above problems, in an optional implementation, the shielding layer 318 may be connected to a second fixed potential input terminal. The second fixed potential input terminal may be, for example, a fixed potential input terminal such as a power supply voltage. This implementation may prevent the display abnormality caused by the shift in the threshold voltage of the thin film transistor, and improve the display uniformity.

In order to further improve the backlight utilization rate, a material of the shielding layer 318 may be a metal material with high reflectivity, and the metal material may include at least one of the followings: molybdenum, aluminum, silver and tin. The shielding layer 318 made of a high reflectivity material may reflect the backlight irradiated on the shielding layer 318 back, and the reflected backlight may be reused, thereby improving the transmittance of the backlight.

The material of the shielding layer 318 may be, for example, Al/top TIN, Al/top Mo, Al alloy/top TIN or Al alloy/top Mo, and these materials have good high temperature stability, and constant reflectivity before and after high temperature annealing.

Referring to FIG. 6, the active area includes an opening area and a non-opening area. There is no overlap exists between an orthographic projection of an inorganic film layer disposed on one side of the substrate 31 that is close to the first thin film transistor 32 on the substrate 31 and the opening area, and the inorganic film layer includes at least one of the following film layers: the buffer layer 319, the first insulating layer 322, and the second insulating layer 35. By removing the inorganic film layer in the opening area, the transmittance of the film layer in the opening area may be improved.

Referring to FIG. 3, FIG. 5, FIG. 6 and FIG. 8, an overlap exists between an orthographic projection of the second transparent electrode layer on the substrate and the opening area; and an overlap exists between an orthographic projection of the first transparent electrode layer on the substrate and the opening area.

In an optional implementation, referring to FIG. 3, FIG. 5, FIG. 6 and FIG. 8, a second thin film transistor 33 is disposed on one side of the buffer layer 319 that is away from the substrate 31, and the second thin film transistor 33 is located in the non-active area.

A material of the active layer of the second thin film transistor 33 may include polycrystalline silicon, which is limited in this embodiment.

In order to simplify the process steps, the structures of the second thin film transistor 33 and the first thin film transistor 32 may be the same, and may be formed at the same time.

It is found by the inventors that, as the pixel density of the displaying base plate becomes higher and higher, the area occupied by a single pixel unit becomes smaller and smaller, resulting in insufficient wiring spaces inside pixels.

In order to solve the above problems, another embodiment of the present disclosure provides a displaying base plate. Referring to FIG. 8, the displaying base plate includes: a substrate 31, a first thin film transistor 32 disposed on one side of the substrate 31, a second insulating layer 35 disposed on one side of the first thin film transistor 32 that is away from the substrate 31, a drain 36 of the first thin film transistor 32 being disposed on one side of the second insulating layer 35 that is away from the substrate 31 and also connected to the first transparent electrode layer 37, a first planarization layer 312 disposed on one side of the first transparent electrode layer 37 that is away from the substrate 31, and a pixel electrode layer 315 disposed on one side of the first planarization layer 312 that is away from the substrate 31.

The drain 36 is connected to the active layer of the first thin film transistor 32 through a via hole. The first transparent electrode layer 37 may be connected to the pixel electrode layer 315 through a via hole. The first transparent electrode layer 37 is configured to transfer the via hole connecting the pixel electrode layer 315 to other non-opening areas. There is no overlap exists between an orthographic projection of the via hole through which the drain 36 is connected to the active layer 32 of the first thin film transistor 32 on the substrate 31 and an orthographic projection of the via hole through which the first transparent electrode layer 37 is connected to the pixel electrode layer 315 on the substrate 31. The first transparent electrode layer 37 functions as a transfer layer. The specific structure of the first transparent electrode layer 37 will be described in detail in subsequent embodiments.

The material of the first transparent electrode layer 37 may be, for example, a transparent conductive material, which is not limited in this embodiment. The transparent conductive material may include, for example, at least one of transparent metal oxides such as indium tin oxide (ITO), indium zinc oxide (IZO), and graphene oxide.

Since the first transparent electrode layer 37 is transparent, the aperture ratio may not be affected even if the first transparent electrode layer 37 is located in the opening area of the active area.

According to the displaying base plate provided in this embodiment, through the first transparent electrode layer 37 with a transfer function, the via hole connecting the pixel electrode layer is transferred to a non-open area with a larger area, such as a scan line area, the via hole connecting the pixel electrode layer is transferred to a non-opening area with a larger area, such as a scan line area, such that a via hole with a larger size may be made, thereby reducing the process difficulty, without affecting an aperture ratio. In this embodiment, the problem of insufficient wiring space caused by the small pixel space of the displaying base plate with high pixel density may be solved.

As shown in FIG. 8, the displaying base plate includes an active area and a non-active area located at the periphery of the active area, wherein the first thin film transistor 32 may be located in the active area, which is limited in this embodiment.

The first thin film transistor 32 may be of a single-gate structure, a double-gate structure or a multi-gate structure, etc., which is not limited in this embodiment.

In an optional implementation, the first thin film transistor 32 is the thin film transistor described in any of the above embodiments, that is, the first thin film transistor 32 is of a double-gate structure, as shown in FIG. 3.

In this implementation, since the first thin film transistor 32 is provided with a higher electric stability and a better voltage retention ratio, the display effect and reliability of the displaying base plate may be improved. In addition, since a channel of the first thin film transistor 32 is an I-type channel, the area occupied in the pixel unit of the displaying base plate is relatively small. Therefore, an aperture ratio of the displaying base plate may be increased, and especially for a displaying base plate with higher pixel density, the aperture ration may be significantly increased. The displaying base plate may be applied to a virtual reality (VR) display technology, an augmented reality (AR) display technology, or the like.

The first thin film transistor 32 may be of a bottom-gate structure, a top-gate structure, etc., which is not limited in this embodiment.

In an optional implementation, referring to FIG. 3 and FIG. 8, the thin film transistor 32 may include an active layer 321, a first insulating layer 322 and a gate layer 323 which are disposed in stack. The active layer may be disposed close to the substrate 31, which is not limited in this embodiment.

The active layer 321 may include a source contact area, a drain contact area, and a channel area connecting the source contact area and the drain contact area. A material of the active layer 321 may include amorphous silicon, polycrystalline silicon or metal oxide, which is limited in this embodiment.

When the first thin film transistor 32 is of a double-gate structure, the structures of the active layer 321, the first insulating layer 322 and the gate layer 323 may be the same as those of the active layer 01, the first insulating layer 02 and the gate layer 03 in the thin film transistor described in any of the above embodiments, respectively, which will not be repeated here.

Referring to FIG. 3 and FIG. 8, the drain 36 is connected to the active layer 321 through a via hole. Specifically, the drain 36 is connected to the drain contact area in the active layer 321 through via holes formed in the second insulating layer 35 and the first insulating layer 322.

Referring to FIG. 4, an active area of the displaying base plate may further include a data line 33 and scan lines 34, which are disposed on one side of the substrate 31 that is close to the first thin film transistor 32, wherein the data line 33 extends in a first direction, and the scan lines 34 extend in a second direction intersecting with the first direction. An orthographic projection of the data line 33 on the substrate 31 and an orthographic projection of the scan lines 34 on the substrate 31 both cover an orthographic projection of a channel area of the active layer 321 on the substrate 31.

In the specific implementation, the second direction may be perpendicular to the first direction, as shown in FIG. 4. Certainly, the second direction may also be another direction intersecting with the first direction, which is not limited in this embodiment.

When the first thin film transistor 32 is the thin film transistor described in any of the above embodiments, as shown in FIG. 4, the scan lines 34 include a first scan line 341 and a second scan line 342. The first gate 14 extends in the second direction to form the first scan line 341, and the second gate 15 extends in the second direction to form the second scan line 342.

Referring to FIG. 3 and FIG. 8, the active layer 321 is connected to the data line 33. Specifically, the source contact area in the active layer 321 is connected to the data line 33 through a via hole.

In order to prevent the channel area in the active layer 321 from occupying an opening area of the active area, an orthographic projection of the channel area (13 in FIG. 4) of the active layer 321 on the substrate 31 may be located in an orthographic projection range of the data line 33 on the substrate 31, such that the aperture ratio of the active area may be increased.

It should be noted that, in order to clearly identify the active layer and the gate layer, one data line 33 on the left of FIG. 4 is not completely shown.

In order to increase the aperture ratio of the active area, an orthographic projection of the active layer 321 on the substrate 31 may be located in an orthographic projection range of the data line 33 on the substrate 31. When the first thin film transistor 32 is the thin film transistor described in any of the above embodiments, as shown in FIG. 4, an orthographic projection of one or more of the first conductor area 111, the second resistance area 112, the third resistance area 121 and the second conductor area 122 on the substrate 31 may also be located in an orthographic projection range of the data line 33 on the substrate 31, which may further increase the aperture ratio of the active area.

When the material of the active layer 01 includes polycrystalline silicon, since the polycrystalline silicon is opaque, the aperture ratio of the active area may be increased significantly by setting an orthographic projection of the entire active layer 01 on the substrate 31 to be in the orthographic projection range of the data line 33 on the substrate 31.

When the first thin film transistor 32 is the thin film transistor described in any of the above embodiments, referring to FIG. 4, the adjacent first scan line 341 and second scan line 342 are connected by a connecting portion 343 located between the adjacent two channel areas 13. The connecting portion 343, the first scan line 341 and the second scan line 342 may be integrated, such that the control signals in the first scan line 341 and the second scan line 342 are the same.

In order to implement the connection between the drain 36 and the first transparent electrode layer 37, in an implementation, as shown in FIG. 5, the first transparent electrode layer 37 may be multiplexed as the drain 36. That is, the drain 36 and the first transparent electrode layer 37 are the same layer of ITO.

It is founded by the inventors that, when the drain 36 is made of a transparent electrode material, the connection between the drain 36 and the active layer 321 (for example, the material is polycrystalline silicon) of the first thin film transistor 32 may have a problem of high contact resistance, which affects the electrical properties of the first thin film transistor 32.

In order to solve the above problems, in another implementation, as shown in FIG. 3 and FIG. 8, a material of the drain 36 is a metal material, and the first transparent electrode layer 37 is disposed on one side of the drain 36 that is away from the substrate 31. By disposing the drain 36 made of a metal material, the contact resistance between the drain 36 and the active layer 321 may be reduced.

In order not to occupy the opening area, the orthographic projection of the drain 36 made of the metal material on the substrate 31 and the orthographic projection of the drain contact area connected to the drain 36 on the substrate 31 may be located in the orthographic projection range of the data line 33 on the substrate 31, such that the aperture ratio of the active area may be increased.

In an optional implementation, as shown in FIG. 3, FIG. 5 and FIG. 8, the first transparent electrode layer 37 includes a first transfer electrode 371 and a second transfer electrode 372 that are integrally formed, the first transfer electrode 371 is connected to the drain 36, and an orthographic projection of the second transfer electrode 372 on the substrate 31 is located in an orthographic projection range of the scan lines 34 on the substrate 31. When the first thin film transistor 32 is the thin film transistor described in any of the above embodiments, the orthographic projection of the second transfer electrode 372 on the substrate 31 is located in an orthographic projection of the first scan line 341, the second scan line 342 and the area between the first scan line 341 and the second scan line 342 on the substrate 31. As shown in FIG. 3 and FIG. 8, the material of the drain 36 is a metal material, the first transfer electrode 371 is disposed on one side of the drain 36 that is away from the substrate plate 31, and is in contact connection (i.e., lap joint) with the drain 36; and as shown in FIG. 5, the first transfer electrode 371 is multiplexed as the drain 36.

In this implementation, orthographic projections of the first transfer electrode 371, the drain 36 and the via hole through which the drain 36 is connected to the active layer 321 on the substrate 31 may overlap with each other. The second transfer electrode 372 is connected to the pixel electrode layer 315 through a via hole, and an overlap exists between the orthographic projection of the second transfer electrode 372 on the substrate 31 and an orthographic projection of the pixel electrode layer 315 on the substrate 31. In this way, by the integrated first transfer electrode 371 and second transfer electrode 372, the via hole connecting the pixel electrode layer may be transferred to a continuous non-opening area with a larger area, such as a scan line area. Since the width of the scan line area (a dimension in the first direction) is larger than the width of the data line 33 (a dimension in the second direction), that is, the area of the continuous non-opening area is larger, a larger-sized via hole may be made to reduce the process difficulty, without affecting the aperture ratio.

The scan line area includes an area corresponding to the first scan line 341, an area corresponding to the second scan line 342, and an area between the first scan line 341 and the second scan line 342.

With the first transparent electrode layer 37 having a transfer function, the problem of insufficient wiring space caused by the small pixel space of a displaying base plate with high pixel density may be solved.

It is found by the inventors that, as the pixel density of the displaying base plate becomes higher and higher, the area occupied by a single pixel unit becomes smaller and smaller, such that an insufficient pixel space results in a small storage capacitance, which in turn leads to insufficient pixel voltage retention capability, resulting in abnormal display.

In order to increase a pixel storage capacitance, referring to FIG. 3, FIG. 5 and FIG. 8, a third insulating layer 38 is disposed on one side of the first transparent electrode layer 37 that is away from the substrate 31, a second transparent electrode layer 39 is disposed on one side of the third insulating layer 38 that is away from the substrate 31, the second transparent electrode layer 39 is connected to a first fixed potential input terminal, and an overlap exists between an orthographic projection of the second transparent electrode layer 39 on the substrate 31 and an orthographic projection of the first transparent electrode layer 37 on the substrate 31.

A material of the second transparent electrode layer 39 may be, for example, a transparent conductive material, which is not limited in this embodiment.

Since an overlap exists between the orthographic projection of the second transparent electrode layer 39 on the substrate 31 and the orthographic projection of the first transparent electrode layer 37 on the substrate 31, a storage capacitor may be formed. In this way, the pixel storage capacitor not only includes a first storage capacitor $C_{st1}$ formed between a pixel electrode layer 315 and a common electrode layer (317 in FIG. 3, FIG. 5, FIG. 6 and FIG. 8), but also includes a second storage capacitor $C_{st2}$ formed by a second transparent electrode layer 39 and a first transparent electrode layer 37, and a third storage capacitor $C_{st3}$ formed by a second transparent electrode layer 39 and a pixel electrode layer, and a total pixel storage capacitance is $C_{st1}+C_{st2}+C_{st3}$, thereby ensuring that there is still sufficient storage capacitance in a small pixel space, thereby ensuring normal display. Since the first transparent electrode layer 37 is connected to the drain 36, a voltage on the first transparent electrode layer 37 is a pixel voltage, and a voltage on the second transparent electrode layer 39 may be, for example, a common voltage.

It is found by the inventors that, if the data line 33 is disposed between the first transparent electrode layer 37 and the second transparent electrode layer 39, a distance between the data line 33 and the first transparent electrode layer 37 is relatively short, and a coupling capacitance formed between the data line 33 and the first transparent electrode layer 37 is relatively large. When a signal on the data line 33 changes at a high frequency, it will interfere with a signal on the first transparent electrode layer 37, which is likely to cause abnormal display of pixels.

In order to solve the above problems of abnormal pixel display, in an optional implementation, as shown in FIG. 3, FIG. 5 and FIG. 8, a fourth insulating layer 310 is disposed on one side of the second transparent electrode layer 39 that is away from the substrate 31, and the data line 33 is disposed on one side of the fourth insulating layer 310 that is away from the substrate 31. A first planarization layer 312 is disposed on one side of the data line 33 that is away from the substrate 31.

In this implementation, the second transparent electrode layer 39 is disposed between the data line 33 and the first transparent electrode layer 37, which may avoid the formation of a coupling capacitance due to the excessively short distance between the data line 33 and the first transparent electrode layer 37. Since the second transparent electrode layer 39 is connected to a fixed potential, even if the signal on the data line 33 changes at a high frequency, the influence of the signal on the data line 33 on the first transparent electrode layer 37 may be shielded, thereby shielding the influence of the data line 33 on the pixel voltage on the pixel electrode layer, so as to realize the normal display of the pixels.

The connection between the data line 33 and the source contact area in the active layer 321 may be implemented in various ways.

In one implementation, referring to FIG. 5, the data line 33 and the source contact area in the active layer 321 may be connected through via holes formed in the fourth insulating layer 310, the third insulating layer 38, the second insulating layer 35 and the first insulating layer 322.

In another implementation, as shown in FIG. 3 and FIG. 8, the displaying base plate may further include a source 311 disposed in the same layer as the drain 36. The data line 33 and the source 311 are connected through the via holes formed in the fourth insulating layer 310 and the third insulating layer 38. The source 311 and the source contact area 11 are connected through the via holes formed in the second insulating layer 35 and the first insulating layer 322. Since the source 311 is configured to implement the connection between the data line 33 and the source contact area 11, the difficulty of the opening process may be reduced and the yield may be increased.

A material of the source 311 may be a metal. In order not to occupy the opening area, an orthographic projection of the source 311 on the substrate 31 and an orthographic projection of the source contact area 11 on the substrate 31 may be located in an orthographic projection range of the data line 33 on the substrate 31, such that the aperture ratio of the active area may be increased.

In the specific implementation, the material of the source 311 may be the same as the material of the drain 36, which is not limited in this embodiment.

Referring to FIG. 3, FIG. 5 and FIG. 8, a first planarization layer 312 may be disposed on one side of the data line 33 that is away from the substrate 31, and a through hole is formed in the first planarization layer 312. The through hole penetrates through the first planarization layer 312, the fourth insulating layer 310 and the third insulating layer 38, and the through hole is configured to expose the second transfer electrode 372. A third transparent electrode layer 313, a second planarization layer 314 and a pixel electrode layer 315 may be disposed in stack on one side of the first planarization layer 312 that is away from the substrate 31, wherein the third transparent electrode layer 313 is disposed close to the substrate 31, an orthographic projection of the third transparent electrode layer 313 on the substrate 31 covers an orthographic projection of the through hole on the substrate 31, the third transparent electrode layer 313 is configured to connect the pixel electrode layer 315 and the second transfer electrode 372, and the second planarization layer 314 is configured to planarize the through hole in the first planarization layer 312.

The through hole in the first planarization layer 312 is planarized by the second planarization layer 314 disposed in the through hole, such that a deep hole structure on the first planarization layer 312 and the light leakage caused by the deep hole structure are eliminated. Therefore, it is not necessary to provide a large light shielding layer to shield a leaked light, thereby increasing an aperture ratio of the active area. Transparent pixel electrodes may be disposed at the position where the through hole is planarized, thereby improving the transmittance of the active area.

In order to form a horizontal electric field, a fifth insulating layer 316 and a common electrode layer 317 are disposed in stack on one side of the pixel electrode layer 315 that is away from the substrate 31, and the fifth insulating layer 316 is disposed close to the substrate 31.

A material of the third transparent electrode layer 313 may be, for example, a transparent conductive material, a material of the pixel electrode layer 315 may be, for example, a transparent conductive material, and a material of the common electrode layer 317 may be, for example, a transparent conductive material, which is not limited in this embodiment.

Since the pixel electrode layer 315 is disposed on a flat surface, a distance between the pixel electrode layer 315 and the common electrode layer may be kept consistent, such that the electric field is uniform and liquid crystals are deflected normally, thereby avoiding the light leakage caused by abnormal liquid crystal deflection. Further, it is not necessary to provide a large light shielding layer to shield the leaked light, thereby increasing a pixel aperture ratio of the active area.

In addition, by disposing the third transparent electrode layer 313 and the pixel electrode layer 315, respectively, the problem that the contact resistance is too large when only the third transparent electrode layer 313 is disposed may be solved. The problem of large contact resistance may be solved by lap-joint another pixel electrode layer 315 on one side of the second planarization layer 314 that is away from the substrate.

The common electrode layer 317 may include a plurality of strip electrodes, which may form a horizontal electric field with the pixel electrode layer 315. The width and spacing of the strip electrodes may be designed according to practical requirements, which is not limited in this embodiment. In order to reduce the light crosstalk between adjacent pixels, a material of the common electrode layer 317 may be a metal.

In order to prevent the channel area of the first thin film transistor 32 located in the active area from being affected by backlight illumination, resulting in changes in the characteristics of the thin film transistor, referring to FIG. 3, FIG. 5 and FIG. 8, a shielding layer 318 may further be disposed between the substrate 31 and the active layer 321. An orthographic projection of the shielding layer 318 on the substrate 31 covers an orthographic projection of the channel area in the active layer 321 on the substrate 31.

In an optional implementation, as shown in FIG. 7, an orthographic projection of the shielding layer 318 on the substrate 31 may cover the orthographic projections of the data line 33 and the scan lines 34 on the substrate 31. That is, the shielding layer 318 is of a mesh structure.

When the first thin film transistor 32 is the thin film transistor described in any of the above embodiments, the orthographic projection of the shielding layer 318 on the substrate 31 may cover the orthographic projections of the first scan line 341, the second scan line 342 and the area between the first scan line 341 and the second scan line 342 on the substrate 31.

The shielding layer 318 of the mesh structure may increase the area of the shielding layer 318 without affecting the aperture ratio, such that more backlight may be reflected and the transmittance of the backlight may be improved.

When the material of the active layer 321 includes polycrystalline silicon, referring to FIG. 3, FIG. 5 and FIG. 8, a buffer layer 319 may also be disposed between the substrate 31 and the active layer 321, and the shielding layer 318 may be disposed between the substrate 31 and the buffer layer 319.

It is found by the inventors that, if the buffer layer 319 is not connected to a fixed potential, induced charges may occur under the influence of an external electric field, thereby causing a shift in the threshold voltage of the first thin film transistor 32 and poor display uniformity.

In order to solve the above problems, in an optional implementation, the shielding layer 318 may be connected to a second fixed potential input terminal. The second fixed potential input terminal may be, for example, a fixed potential input terminal such as a power supply voltage. This implementation may prevent the display abnormality caused by the shift in the threshold voltage of the thin film transistor, and improve the display uniformity.

In order to further improve the backlight utilization rate, a material of the shielding layer 318 may be a metal material with high reflectivity, and the metal material may include at least one of the followings: molybdenum, aluminum, silver and tin. The shielding layer 318 made of a high reflectivity material may reflect the backlight irradiated on the shielding layer 318 back, and the reflected backlight may be reused, thereby improving the transmittance of the backlight.

The material of the shielding layer 318 may be, for example, Al/top TIN, Al/top Mo, Al alloy/top TIN or Al alloy/top Mo. and these materials are provided with good high temperature stability, and constant reflectivity before and after high temperature annealing.

Referring to FIG. 6, the active area includes an opening area and a non-opening area. There is no overlap exists between an orthographic projection of an inorganic film layer disposed on one side of the substrate 31 that is close to the first thin film transistor 32 on the substrate 31 and the opening area, and the inorganic film layer includes at least one of the following film layers: the buffer layer 319, the first insulating layer 322, and the second insulating layer 35. By removing the inorganic film layer in the opening area, the transmittance of the film layer in the opening area may be improved.

Referring to FIG. 3, FIG. 5, FIG. 6 and FIG. 8, overlap exists between an orthographic projection of the second transparent electrode layer on the substrate and the opening area; and an overlap exists between an orthographic projection of the first transparent electrode layer on the substrate and the opening area.

In an optional implementation, referring to FIG. 3, FIG. 5, FIG. 6 and FIG. 8, a second thin film transistor 33 is disposed on one side of the buffer layer 319 that is away from the substrate 31, and the second thin film transistor 33 is located in the non-active area.

A material of an active layer of the second thin film transistor may include polycrystalline silicon, which is limited in this embodiment.

In order to simplify the process steps, the structures of the second thin film transistor 33 and the first thin film transistor 32 may be the same, and may be formed at the same time.

Figure 9:
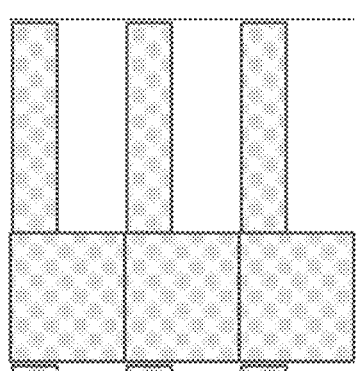
FIG. 9 is a schematic planar view of the displaying base plate on which a shielding layer is manufactured.
Figure 10:
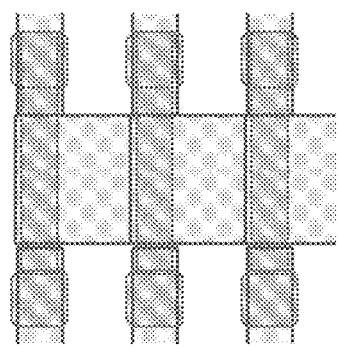
FIG. 10 is a schematic planar view of the displaying base plate on which an active layer is manufactured.
Figure 11:
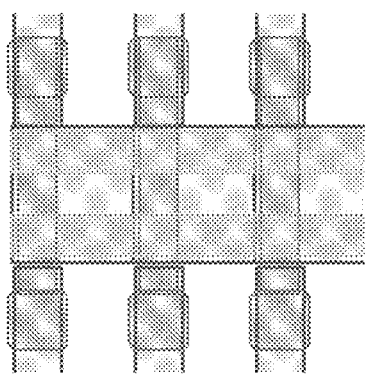
FIG. 11 is a schematic planar view of the displaying base plate on which a gate layer is manufactured.
Figure 12:
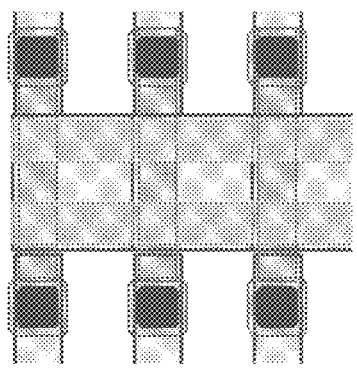
FIG. 12 is a schematic planar view of the displaying base plate on which a second insulating layer is manufactured.
Figure 13:
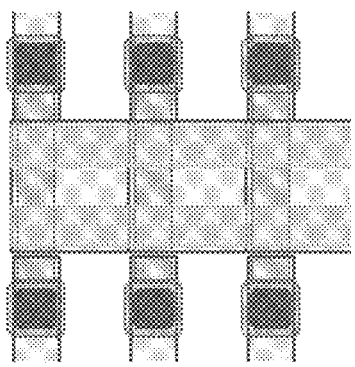
FIG. 13 is a schematic planar view of the displaying base plate on which a source-drain electrode layer is manufactured.
Figure 14:
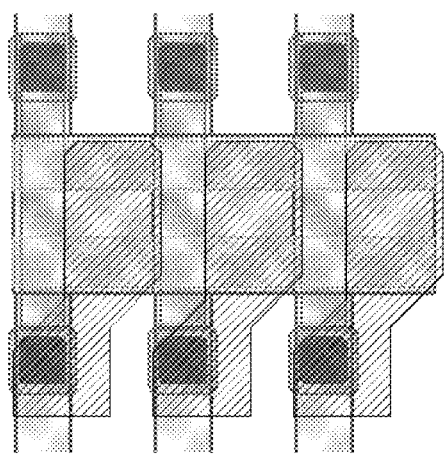
FIG. 14 is a schematic planar view of the displaying base plate on which a first transparent electrode layer is manufactured.
Figure 15:
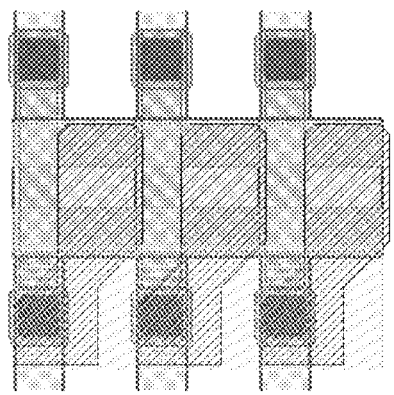
FIG. 15 is a schematic planar view of the displaying base plate on which a second transparent electrode layer is manufactured.
Figure 16:
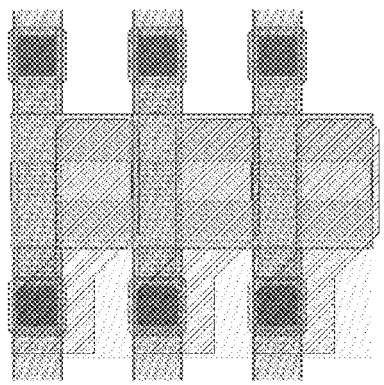
FIG. 16 is a schematic planar view of the displaying base plate on which a data line is manufactured.
Figure 17:
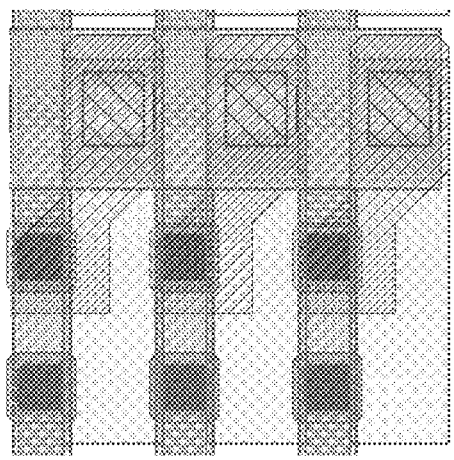
FIG. 17 is a schematic planar view of the displaying base plate on which a pixel electrode layer is manufactured.
Figure 18:
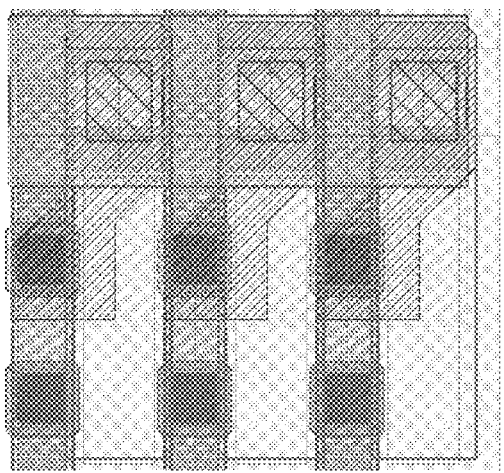
FIG. 18 is a schematic planar view of the displaying base plate on which a common electrode layer is manufactured.

An embodiment of the present disclosure provides a manufacturing method for a displaying base plate, which may be configured to prepare the displaying base plate shown in FIG. 3 and FIG. 8. The manufacturing method specifically includes the following steps:

Step 1: manufacturing a shielding layer, the shielding layer shielding a channel area of a first thin film transistor to prevent backlight from affecting the characteristics of the thin film transistor, wherein FIG. 9 is a schematic planar view of the displaying base plate on which the shielding layer is manufactured;

Step 2: manufacturing a buffer layer and an active layer, the active layer being located in a subsequent data line area, wherein FIG. 10 is a schematic planar view of the displaying base plate on which the active layer is manufactured;

Step 3: manufacturing a first insulating layer and a gate layer, the gate layer being located in the shielding layer area to ensure that the channel area in the active layer is shielded by the shielding layer, wherein FIG. 11 is a schematic planar view of the displaying base plate on which the gate layer is manufactured;

Step 4: manufacturing a second insulating layer, holes being drilled in the corresponding positions of a source contact area and a drain contact area of the active layer (in FIG. 12, an upper dark square area corresponds to the source contact area, and a lower dark square area corresponds to the drain contact area), which facilitates the lap joint of subsequent film layers and the active layer, wherein FIG. 12 is a schematic planar view of the displaying base plate on which the second insulating layer is manufactured;

Step 5: manufacturing a source-drain electrode layer, the source-drain electrode layer including a source and a drain, and being connected to the source contact area and the drain contact area of the active layer through via holes, respectively, wherein FIG. 13 is a schematic planar view of the displaying base plate on which the source-drain electrode layer is manufactured:

Step 6: manufacturing a first transparent electrode layer, the first transparent electrode layer including a first transfer electrode and a second transfer electrode, the first transfer electrode being in lap joint with the drain, wherein FIG. 14 is a schematic planar view of the displaying base plate on which the first transparent electrode layer is manufactured;

Step 7: manufacturing a third insulating layer and a second transfer electrode layer, wherein FIG. 15 is a schematic planar view of the displaying base plate on which the second transparent electrode layer is manufactured;

Step 8: manufacturing a fourth insulating layer and a data line, the data line being connected to the source contact area of the active layer through a via hole, wherein FIG. 16 is a schematic planar view of the displaying base plate on which the data line is manufactured:

Step 9: manufacturing a first planarization layer first, a through hole being formed in the first planarization layer and corresponding to the second transfer electrode in position, then manufacturing a third transfer electrode layer to cover the through hole, next, manufacturing a second planarization layer to planarize the through hole, and then, manufacturing a pixel electrode layer, which is in lap joint with the third transparent electrode layer, wherein FIG. 17 is a schematic planar view of the displaying base plate on which the pixel electrode layer is manufactured; and Step 10: manufacturing a fifth insulating layer and a common electrode layer, the common electrode layer and the pixel electrode layer forming an electric field to realize liquid crystal driving, wherein FIG. 18 is a schematic planar view of the displaying base plate on which the common electrode layer is manufactured.

In order to obtain the displaying base plate shown in FIG. 6, after the Step 5 is completed, the buffer layer, the first insulating layer, the second insulating layer and other inorganic film layers in the opening area may be removed by an etching process, so as to improve the film layer transmittance in the opening area.

Another embodiment of the present disclosure further provides a displaying apparatus. The displaying apparatus may include the displaying base plate described in any of the embodiments.

It should be noted that the displaying apparatus in this embodiment may be any product or component having a display function, such as a display panel, electronic paper, a mobile phone, a tablet computer, a television, a notebook computer, a digital photo frame, a navigator or the like.

Yet another embodiment of the present disclosure provides a manufacturing method for a thin film transistor. The manufacturing method includes the following steps:

Step 1: forming an active layer;

Step 2: forming a first insulating layer on one side of the active layer; and

Step 3: forming a gate layer on one side of the first insulating layer that is away from the active layer, and performing conductive treatment on the active layer to form a source contact area, a drain contact area and a channel area connecting the source contact area and the drain contact area, wherein the channel area includes a first channel area, a first resistance area and a second channel area sequentially disposed in a first direction; the gate layer includes a first gate and a second gate which are separately disposed; an orthographic projection of the first gate on a plane where the active layer is located covers the first channel area, and an orthographic projection of the second gate on a plane where the active layer is located covers the second channel area.

By using the manufacturing method provided in this embodiment, the thin film transistor of any of the above embodiments may be obtained.

In an optional implementation, a material of the active layer includes polycrystalline silicon; a gate layer is formed on one side of the first insulating layer that is away from the active layer; and the step of performing conductive treatment on the active layer to form the source contact area, the drain contact area and the channel area connecting the source contact area and the drain contact area includes:

forming a gate metal layer on one side of the first insulating layer that is away from the active layer;

patterning the gate metal layer by using a first patterning process to form a single-gate structure, wherein the single-gate structure includes a first gate, a second gate, and an intermediate portion connecting the first gate and the second gate, which are integrated; an edge of the single-gate structure is indented relative to an edge of first photoresist covering the single-gate structure;

performing a first doping process on the active layer by using the first photoresist as a mask, to form a first conductor area and a second conductor area;

performing dry etching on the first photoresist, such that the edge of the first photoresist is aligned with the edge of the single-gate structure;

performing a second doping process on the active layer by using the etched first photoresist as a mask, to form a second resistance area and a third resistance area, wherein a doping concentration of the second doping process is less than a doping concentration of the first doping process; the second resistance area and the first conductor area form the source contact area; the third resistance area and the second conductor area form the drain contact area;

stripping the first photoresist;

patterning the single-gate structure by using a second patterning process, to form the gate layer;

performing a third doping process on the active layer by using second photoresist covering the gate layer in the second patterning process as a mask, to form the first resistance area, wherein a doping concentration of the third doping process is less than the doping concentration of the first doping process; the first channel area is located between the first resistance area and the second resistance area; and the second channel area is located between the first resistance area and the third resistance area; and stripping the second photoresist to obtain the thin film transistor.

Figure 19:
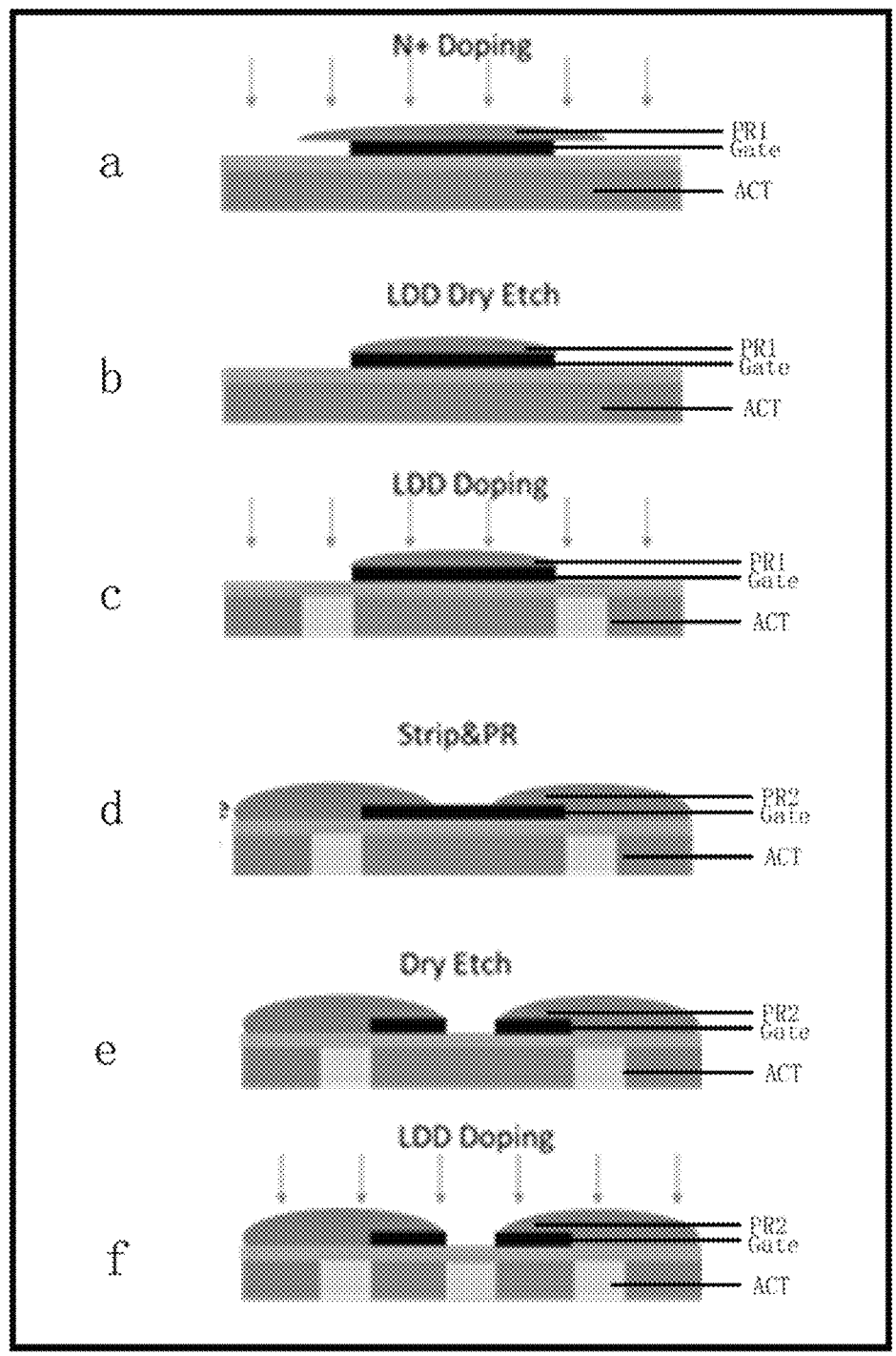
FIG. 19 is a schematic flowchart of a manufacturing process of a thin film transistor provided by an embodiment of the present disclosure.

In this implementation, referring to FIG. 19, the manufacturing process may include the following steps:

a: patterning the gate metal layer by using the first patterning process (e.g., a wet etching process) to form a single-gate structure Gate which is indented relative to the edge of the first photoresist PR1 covering the single-gate structure Gate; and performing a first doping process (e.g., a heavy doping process N+ Doping) on the active layer ACT by taking the first photoresist PR1 as a mask layer, to form a first conductor area and a second conductor area;

b: etching the first photoresist PR1 by using a dry etching process into a pattern which is the same as the single-gate structure Gate;

c: performing a second doping process (e.g., LDD doping) on the active layer ACT by taking the dry-etched first photoresist PR1 as a mask to form a second resistance area and a third resistance area, thereby obtaining a lightly doped drain (LDD) structure;

d: striping the first photoresist PR1, coating second photoresist PR2, and performing an exposure and development process to obtain the patterned second photoresist PR2;

e: patterning (e.g., dry etching) the single-gate structure Gate to form a double-gate structure; and f: performing a third doping process (e.g., LDD doping) on the active layer ACT by taking the second photoresist PR2 covering the double-gate structure as a mask to form a first resistance area, a first channel area and a second channel area, and then stripping the second photoresist PR2 to obtain the thin film transistor according to any one of the above embodiments (FIG. 1 and FIG. 2).

In another optional implementation, a material of the active layer includes polycrystalline silicon; a gate layer is formed on one side of the first insulating layer that is away from the active layer, and the step of performing conductive treatment on the active layer to form the source contact area, the drain contact area and the channel area connecting the source contact area and the drain contact area includes:

forming a gate metal layer on one side of the first insulating layer that is away from the active layer;

patterning the gate metal layer by using a first patterning process to form a single-gate structure, wherein the single-gate structure includes a first gate, second gate, and an intermediate portion connecting the first gate and the second gate, which are integrated, an edge of the single-gate structure is indented relative to an edge of first photoresist covering the single-gate structure;

performing a first doping process on the active layer by using the first photoresist as a mask, to form a first conductor area and a second conductor area;

stripping the first photoresist;

patterning the single-gate structure by using a third patterning process, to form a gate layer; and performing a fourth doping process on the active layer by using the gate layer as a mask, to form the first resistance area, the second resistance area and the third resistance area, wherein a doping concentration of the fourth doping process is less than a doping concentration of the first doping process; the second resistance area and the first conductor area form the source contact area, the third resistance area and the second conductor area form the drain contact area, the first channel area is located between the first resistance area and the second resistance area; and the second channel area is located between the first resistance area and the third resistance area.

Figure 20:
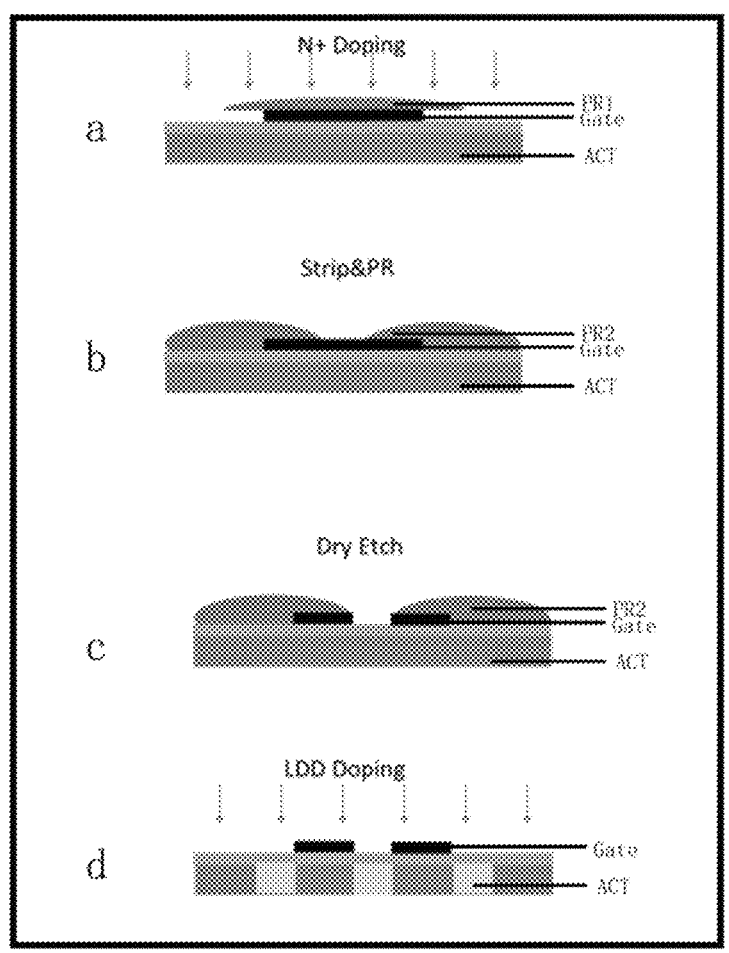
FIG. 20 is a schematic flowchart of a manufacturing process of a thin film transistor provided by an embodiment of the present disclosure.

In this implementation, referring to FIG. 20, the manufacturing process may include the following steps:

a: patterning the gate metal layer by using a first patterning process (e.g., a wet etching process) to form a single-gate structure Gate which is indented relative to the edge of the first photoresist PR1 covering the single-gate structure Gate; and performing a first doping process (e.g., a heavy doping process N+ Doping) on the active layer ACT by taking the first photoresist PR1 as a mask layer, to form a first conductor area and a second conductor area;

b: striping the first photoresist PR1, coating second photoresist PR2, and performing an exposure and development process to obtain the patterned second photoresist PR2;

c: patterning (e.g., dry etching) the single-gate structure Gate to form a double-gate structure; and d: stripping the second photoresist PR2, and performing a fourth doping process (e.g., LDD doping) on the active layer ACT by taking the double-gate structure as a mask to form a first resistance area, a second resistance area and a third resistance area, thereby forming a lightly doped drain (LDD) structure. The thin film transistor according to any one of the above embodiments (FIG. 1 and FIG. 2) is manufactured.

The step of patterning the gate metal layer may include: performing wet etching on the gate metal layer.

The step of patterning the single-gate structure may include: performing dry etching on the intermediate portion of the single-gate structure.

The respective embodiments of the present description are described in a progressive manner, the focus of each embodiment illustrates the differences from other embodiments, and the same or similar parts among the embodiments may refer to one another.

Eventually, it should be noted that, as used herein, relation terms such as "first" and "second" are used merely to distinguish a subject or an operation from another subject or another operation, and not to imply any substantial relation or order between these subjects or operations. Moreover, terms "include", "contain" or any variation thereof are intended to cover a nonexclusive containing, such that a process, a method, an item or a device containing a series of elements not only includes these elements, but also includes other elements that are not set forth specifically, or also includes an inherent element of such a process, method, item or device. Without further limitation, an element defined by a phrase "include a" does not mean that other elements are excluded from the process, method, item or device including the same element.

The thin film transistor and the manufacturing method therefor, the displaying base plate and the displaying apparatus provided by the present disclosure have been introduced in detail. Specific examples are used herein to illustrate the principles and implementations of the present disclosure. The description of the above embodiments is only used to help the understanding of the methods and core ideas of the present disclosure. At the same time, for those of ordinary skill in the art, according to the ideas of the present disclosure, there will be changes in the specific implementations and the scope of application. In summary, the content of the present description should not be construed as a limitation of the present disclosure.

Other implementations of the present disclosure will be apparent to those skilled in the art from consideration of the specification and practice the present disclosure herein. The present disclosure is intended to cover any variations, uses, or adaptations of the present disclosure, following the general principles thereof and including common knowledge or commonly used technical measures which are not disclosed herein. The specification and embodiments are to be considered as exemplary only, and the true scope and spirit of the present disclosure are indicated by the following claims.

It will be appreciated that the present disclosure is not limited to the exact construction that has been described above and illustrated in the accompanying drawings, and that various modifications and changes may be made without departing from the scope thereof. It is intended that the scope of the present disclosure is only limited by the appended claims.

The term 'one embodiment', 'embodiment', or 'one or more embodiments' in this disclosure means that specific features, structures, or characteristics described in combination with embodiments are included in at least one embodiment in this publication. In addition, note that the word 'in one embodiment' here does not necessarily refer to the same embodiment.

In the instructions provided here, a large number of specific details are explained. However, it is understandable that this public implementation case can be practiced without these specific details. In some examples, the notified methods, structures and technologies are not shown in detail, so that the understanding of this specification is not blurred.

In claims, any reference symbol between brackets should not be constructed as a restriction on claims. The word 'contain' does not exclude the existence of elements or steps not listed in the claims. The word 'a' or 'an' before the element does not exclude the existence of multiple such elements. This disclosure can be realized by means of hardware including several different components and computer with appropriate programming. In listing the unit rights requirements of several devices, several of these devices can be specifically reflected by the same hardware item. The use of the first, second and third words does not indicate any order. These words can be interpreted as names.

Finally, it should be noted that the above implementation cases are only used to illustrate the technical scheme of this disclosure rather than limit it; notwithstanding the detailed description of this publication in the light of the above implementations, the general technical staff in this field should understand that they still have access to the technologies recorded in the above implementations.

The invention claimed is:

1. A displaying base plate, comprising a substrate and a first thin film transistor disposed on one side of the substrate, the thin film transistor comprising an active layer, a first insulating layer, and a gate layer which are disposed in stack, wherein the active layer comprises a source contact area, a drain contact area, and a channel area connecting the source contact area and the drain contact area; the channel area comprises a first channel area, a first resistance area and a second channel area sequentially disposed in a first direction, the gate layer comprises a first gate and a second gate which are separately disposed; an orthographic projection of the first gate on a plane where the active layer is located covers the first channel area, and an orthographic projection of the second gate on a plane where the active layer is located covers the second channel area, the displaying base plate comprises an active area and a non-active area located at the periphery of the active area, and the first thin film transistor is located in the active area, the active area further comprises a data line and scan lines, which are disposed on one side of the substrate that is close to the first thin film transistor; the data line extends in the first direction, the scan lines comprise a first scan line and a second scan line, the first gate extends in a second direction intersecting with the first direction to form the first scan line, the second gate extends in the second direction to form the second scan line, the source contact area is connected to the data line; and an orthographic projection of the channel area on the substrate is located in an orthographic projection range of the data line on the substrate, the active layer is located on one side of the gate layer that is close to the substrate, a second insulating layer is disposed on one side of the gate layer that is away from the substrate, a drain of the first thin film transistor is disposed on one side of the second insulating layer that is away from the substrate plate, the drain and the drain contact area are connected through via holes formed in the second insulating layer and the first insulating layer, and the drain is also connected to a first transparent electrode layer, a third insulating layer is disposed on one side of the first transparent electrode layer that is away from the substrate; a second transparent electrode layer is disposed on one side of the third insulating layer that is away from the substrate, the second transparent electrode layer is connected to a first fixed potential input terminal, and an overlap exists between an orthographic projection of the second transparent electrode layer on the substrate and the orthographic projection of the first transparent electrode layer on the substrate, a fourth insulating layer is disposed on one side of the second transparent electrode layer that is away from the substrate; the data line is disposed on one side of the fourth insulating layer that is away from the substrate plate, and the data line and the source contact area are connected through via holes formed in the fourth insulating layer, the third insulating layer, the second insulating layer and the first insulating layer, the first transparent electrode layer comprises a first transfer electrode and a second transfer electrode that are integrally formed, the first transfer electrode is connected to the drain, an orthographic projection of the second transfer electrode on the substrate is located in an orthographic projection range of the first scan line, the second scan line, and an area between the first scan line and the second scan line on the substrate, a first planarization layer is disposed on one side of the data line that is away from the substrate, and a through hole is formed in the first planarization layer, the through hole penetrates through the first planarization layer, the fourth insulating layer and the third insulating layer, to expose the second transfer electrode, and a third transparent electrode layer, a second planarization layer and a pixel electrode layer are disposed in stack on one side of the first planarization layer that is away from the substrate, wherein the third transparent electrode layer is disposed close to the substrate, an orthographic projection of the third transparent electrode layer on the substrate covers an orthographic projection of the through hole on the substrate, the third transparent electrode layer is configured to connect the pixel electrode layer and the second transfer electrode, and the second planarization layer is configured to planarize the through hole.

2. The displaying base plate according to claim 1, wherein a material of the drain is a metal, an orthographic projection of the drain on the substrate and an orthographic projection of the drain contact area on the substrate are located in the orthographic projection range of the data line on the substrate, and the first transparent electrode layer is disposed on one side of the drain that is away from the substrate.

3. The displaying base plate according to claim 1, further comprising a source disposed in the same layer as the drain, the data line and the source are connected through the via holes formed in the fourth insulating layer and the third insulating layer, the source and the source contact area are connected through the via holes formed in the second insulating layer and the first insulating layer, a material of the source is a metal, and an orthographic projection of the source on the substrate and an orthographic projection of the source contact area on the substrate are located in the orthographic projection range of the data line on the substrate.

4. The displaying base plate according to claim 1, wherein a fifth insulating layer and a common electrode layer are disposed in stack on one side of the pixel electrode layer that is away from the substrate, the fifth insulating layer is disposed close to the substrate, the common electrode layer comprises a plurality of strip electrodes, and a material of the common electrode layer is a metal.

5. The displaying base plate according to claim 1, wherein the active area comprises an opening area and a non-opening area, a material of the active layer comprises polycrystalline silicon, a buffer layer is further displayed between the substrate and the active layer; and an overlap exists between an orthographic projection of an inorganic film layer disposed on one side of the substrate that is close to the first thin film transistor on the substrate and the opening area; and the inorganic film layer comprises at least one of the following film layers: the buffer layer, the first insulating layer, and the second insulating layer.

6. The displaying base plate according to claim 5, wherein an overlap exists between an orthographic projection of the second transparent electrode layer on the substrate and the opening area; and an overlap exists between an orthographic projection of the first transparent electrode layer on the substrate and the opening area.

7. The displaying base plate according to claim 5, wherein a second thin film transistor is disposed on one side of the buffer layer that is away from the substrate, the second thin film transistor is located in the non-active area, and a material of an active layer of the second thin film transistor comprises polycrystalline silicon.

8. The displaying base plate according to claim 1, wherein a shielding layer is further disposed between the substrate and the active layer, and an orthographic projection of the shielding layer on the substrate covers an orthographic projection of the channel area on the substrate.

9. A displaying apparatus, comprising the displaying base plate according to claim 1.

10. The displaying base plate according to claim 1, wherein the material of the active layer comprises the polycrystalline silicon, the source contact area comprises a second resistance area and a first conductor area, the second resistance area being disposed close to the first channel area, the drain contact area comprises a third resistance area and a second conductor area, the third resistance area being disposed close to the second channel area, and wherein the first resistance area, the second resistance area and the third resistance area are lightly doped areas, and the first conductor area and the second conductor area are heavily doped areas.

11. The displaying base plate according to claim 10, wherein the second resistance area, the first conductor area, the third resistance area and the second conductor area are disposed in the first direction, and in the first direction, a width of the first resistance area is greater than a width of the second resistance area and a width of the third resistance area.

* * * * *